US010095076B2

(12) United States Patent
Kurokawa et al.

(10) Patent No.: US 10,095,076 B2
(45) Date of Patent: Oct. 9, 2018

(54) SEMICONDUCTOR DEVICE HAVING A BACKLIGHT AND LIGHT-RECEIVING ELEMENT

(71) Applicant: Semiconductor Energy Laboratory Co., Ltd., Atsugi-shi, Kanagawa-ken (JP)

(72) Inventors: Yoshiyuki Kurokawa, Sagamihara (JP); Takayuki Ikeda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/432,128

(22) Filed: Feb. 14, 2017

(65) Prior Publication Data
US 2017/0153474 A1 Jun. 1, 2017

Related U.S. Application Data

(63) Continuation of application No. 12/985,371, filed on Jan. 6, 2011, now Pat. No. 9,575,381.

(30) Foreign Application Priority Data

Jan. 15, 2010 (JP) .................. 2010-006444
Jan. 15, 2010 (JP) .................. 2010-006445
Jan. 15, 2010 (JP) .................. 2010-006449

(51) Int. Cl.
*G02F 1/135* (2006.01)
*H01L 31/14* (2006.01)
(Continued)

(52) U.S. Cl.
CPC .......... *G02F 1/1354* (2013.01); *G02F 1/1368* (2013.01); *G02F 1/133345* (2013.01);
(Continued)

(58) Field of Classification Search
CPC ......... H01L 27/14616; H01L 27/14614; H01L 29/7869; H01L 31/145; H01L 27/1443;
(Continued)

(56) References Cited

U.S. PATENT DOCUMENTS 5,124,768 A * 6/1992 Mano .................... G02F 1/1368
257/347
5,731,856 A 3/1998 Kim et al.
(Continued)

FOREIGN PATENT DOCUMENTS

CN 101366120 A 2/2009
EP 1737044 A 12/2006
(Continued)

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.
(Continued)

Primary Examiner — Twyler Haskins
Assistant Examiner — Akshay Trehan
(74) Attorney, Agent, or Firm — Robinson Intellectual Property Law Office; Eric J. Robinson

(57) ABSTRACT

A semiconductor device includes a photodiode, a first transistor, and a second transistor. The photodiode has a function of supplying a charge corresponding to incident light to a gate of the first transistor, the first transistor has a function of accumulating the charge supplied to the gate, and the second transistor has a function of retaining the charge accumulated in the gate of the first transistor. The second transistor includes an oxide semiconductor.

16 Claims, 12 Drawing Sheets

(51) Int. Cl.
| | | |
|---|---|---|
| *H01L 29/24* | (2006.01) | |
| *H01L 29/786* | (2006.01) | |
| *H01L 27/12* | (2006.01) | |
| *H04N 5/369* | (2011.01) | |
| *G09G 3/36* | (2006.01) | |
| *G02F 1/1368* | (2006.01) | |
| *G02F 1/1333* | (2006.01) | |
| *H01L 27/144* | (2006.01) | |

(52) U.S. Cl.
CPC ....... *G09G 3/3648* (2013.01); *H01L 27/1225* (2013.01); *H01L 27/1248* (2013.01); *H01L 27/1443* (2013.01); *H01L 29/24* (2013.01); *H01L 29/7869* (2013.01); *H01L 31/145* (2013.01); *H04N 5/3696* (2013.01); *G02F 2202/10* (2013.01); *G09G 2360/144* (2013.01); *G09G 2360/145* (2013.01)

(58) Field of Classification Search
CPC ... H01L 29/24; H01L 27/1225; G02F 1/1362; G02F 1/1354; G02F 1/1368; G02F 1/133345; G02F 2202/10; H04N 5/3696; G09G 3/3648; G09G 2360/145; G09G 2360/144
See application file for complete search history.

(56) References Cited

U.S. PATENT DOCUMENTS

| | | | |
|---|---|---|---|
| 5,744,864 | A | 4/1998 | Cillessen et al. |
| 5,880,777 | A | 3/1999 | Savoye et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,747,638 | B2 | 6/2004 | Yamazaki et al. |
| 6,960,757 | B2 | 11/2005 | Merrill et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,068,254 | B2 * | 6/2006 | Yamazaki ............ G06K 9/0004 345/102 |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,417,268 | B2 | 8/2008 | Cazaux et al. |
| 7,423,678 | B2 | 9/2008 | Shimizu |
| 7,427,776 | B2 * | 9/2008 | Hoffman ............. H01L 29/0673 257/59 |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,525,523 | B2 | 4/2009 | Yamazaki et al. |
| 7,663,165 | B2 | 2/2010 | Mouli |
| 7,674,650 | B2 | 3/2010 | Akimoto et al. |
| 7,732,819 | B2 | 6/2010 | Akimoto et al. |
| 7,755,597 | B2 | 7/2010 | Naka et al. |
| 7,855,369 | B2 | 12/2010 | Takahashi |
| 8,164,256 | B2 * | 4/2012 | Sano ................... H01L 29/7869 313/505 |
| 8,378,391 | B2 | 2/2013 | Koyama et al. |
| 8,384,008 | B2 | 2/2013 | Gomi |
| 8,415,198 | B2 | 4/2013 | Itagaki et al. |
| 8,440,977 | B2 | 5/2013 | Ishii et al. |
| 8,513,710 | B2 | 8/2013 | Mabuchi |
| 8,541,944 | B2 | 9/2013 | Sano et al. |
| 8,547,463 | B2 | 10/2013 | Mabuchi |
| 8,785,240 | B2 | 7/2014 | Watanabe |
| 2001/0046027 | A1 | 11/2001 | Tai et al. |
| 2002/0011972 | A1 * | 1/2002 | Yamazaki ......... H01L 27/14678 345/74.1 |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0040393 | A1 * | 2/2005 | Hong ................ H01L 27/14603 257/40 |
| 2005/0116289 | A1 | 6/2005 | Boyd et al. |
| 2005/0199959 | A1 | 9/2005 | Chiang et al. |
| 2005/0275038 | A1 * | 12/2005 | Shih ................... H01L 29/78633 257/382 |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0157760 | A1 * | 7/2006 | Hayashi ................ G03B 7/00 257/293 |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0018075 | A1 * | 1/2007 | Cazaux ............. H01L 27/14609 250/208.1 |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054467 | A1 * | 3/2007 | Currie ............... H01L 21/76254 438/458 |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0054319 | A1 * | 3/2008 | Mouli ............... H01L 27/14609 257/292 |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0290382 | A1 | 11/2008 | Hirota |
| 2008/0296568 | A1 | 12/2008 | Ryu et al. |

(56) References Cited

U.S. PATENT DOCUMENTS

| | | | |
|---|---|---|---|
| 2009/0068773 | A1 | 3/2009 | Lai et al. |
| 2009/0072122 | A1* | 3/2009 | Tada ................ H01L 27/14647 250/208.1 |
| 2009/0073325 | A1 | 3/2009 | Kuwabara et al. |
| 2009/0101948 | A1 | 4/2009 | Park et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0155940 | A1* | 6/2009 | Lee .................... H01L 29/7869 438/29 |
| 2009/0179239 | A1 | 7/2009 | Park et al. |
| 2009/0278122 | A1 | 11/2009 | Hosono et al. |
| 2009/0280600 | A1 | 11/2009 | Hosono et al. |
| 2009/0295769 | A1 | 12/2009 | Yamazaki et al. |
| 2010/0013972 | A1 | 1/2010 | Adkisson et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0149138 | A1* | 6/2010 | Lee ...................... G09G 3/3648 345/204 |
| 2010/0182282 | A1 | 7/2010 | Kurokawa et al. |
| 2011/0043488 | A1 | 2/2011 | Kurokawa et al. |
| 2013/0119380 | A1 | 5/2013 | Koyama et al. |

FOREIGN PATENT DOCUMENTS

| | | |
|---|---|---|
| EP | 2226847 A | 9/2010 |
| FR | 2888989 | 1/2007 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 8/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-292276 A | 10/2001 |
| JP | 2002-076356 A | 3/2002 |
| JP | 2002-246580 A | 8/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-140149 A | 5/2004 |
| JP | 2004-159155 A | 6/2004 |
| JP | 2004-273614 A | 9/2004 |
| JP | 2004-273732 A | 9/2004 |
| JP | 2006-286848 A | 10/2006 |
| JP | 2008-053356 A | 3/2008 |
| JP | 2008-060419 A | 3/2008 |
| JP | 2008-141119 A | 6/2008 |
| JP | 2008-281988 A | 11/2008 |
| JP | 2008-311342 A | 12/2008 |
| JP | 2009-105381 A | 5/2009 |
| JP | 2009-130209 A | 6/2009 |
| JP | 2009-133837 A | 6/2009 |
| JP | 2009-535819 | 10/2009 |
| JP | 2011-119950 A | 6/2011 |
| KR | 2008-0094772 A | 10/2008 |
| TW | 200702792 | 1/2007 |
| WO | WO-2004/114391 | 12/2004 |
| WO | WO-2008/023553 | 2/2008 |
| WO | WO-2008/027392 | 3/2008 |
| WO | WO-2008/069286 | 6/2008 |
| WO | WO-2008/126879 | 10/2008 |
| WO | WO-2009/060968 | 5/2009 |

OTHER PUBLICATIONS

Invitation to pay additional fees (Application No. PCT/JP2010/073658), International Searching Authority, dated Jan. 25, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel, YBFE2O4, and YB2FE3O7 Types of Structures for Compounds in the In2O3 and SC2O3-A2O3-BO Systems [A; Fe, Ga, Or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transaction on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Material), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono,H, "68.3:Invited Paper:Transparent Amorphous Oxide Semiconductors for High Performance TFT", SID Digest '07 : SID International Symposium Digest Papers, 2007, vol. 38, pp. 1830-1833.

(56) References Cited

OTHER PUBLICATIONS

Hirao.T et al., "Novel Top-Gate Zinc Oxide Thin-Film Transistors (ZnO TFts) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown Zn TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phased for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong,J et al.. "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al3, "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:A; and Sn-Doped Zinc Indium Oxide Thin Film Transistors for AMOLED Backplane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn—Oxide TFTs With a Novel Passivation Layer", SID Digest'09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada,T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41- 44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m < 4):a Zn4s conductor", Philisophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.
Janotti.A et al., "Native Point Defects in ZnO", Phys, Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phy. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park. Sang-Hee et al., "42.3: Transparent ZnO Thin Film Transistor for the Application of High Aperture Ratio Bottom Emission

(56) References Cited

OTHER PUBLICATIONS

AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—0 TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electro. Soc. (Jounal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, pp. 80-803.

Ueno.K et al., "Field-Effect Transistor on SrTiO3 With Sputtered Al12O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

European Search Report (Application No. 10843200.6) dated May 16, 2014.

Chinese Office Action (Application No. 201080060657.7) dated Sep. 3, 2014.

Taiwanese Office Action (Application No. 100101261) dated Apr. 23, 2015.

Korean Office Action (Application No. 2012-7017993) dated Apr. 18, 2017.

\* cited by examiner

SEMICONDUCTOR DEVICE HAVING A BACKLIGHT AND LIGHT-RECEIVING ELEMENT

TECHNICAL FIELD

The technical field relates to a photosensor and a driving method thereof. The technical field also relates to a display device including a photosensor and a driving method thereof. Further, the technical field relates to a semiconductor device including a photosensor and a driving method thereof.

BACKGROUND ART

In recent years, a display device provided with a light-detecting sensor (also referred to as a photosensor) has attracted attention. In the display device including a photosensor, a display screen also serves as an input region. A display device having an image pickup function is an example of such a display device (see Patent Document 1, for example).

Examples of a semiconductor device provided with a photosensor are a CCD image sensor and a CMOS image sensor. Such image sensors are used in, for example, electronic apparatuses like digital still cameras or cellular phones.

In a display device including a photosensor, first, light is emitted from the display device. When the light enters a region where an object to be detected exists, the light is blocked by the object to be detected, and is partly reflected. The light reflected by the object to be detected is detected by the photosensor provided in a pixel in the display device, whereby the object to be detected can be found in the region.

In a semiconductor device including a photosensor, light emitted from an object to be detected or external light reflected by the object to be detected is detected directly by the photosensor or condensed by an optical lens or the like and then detected.

REFERENCE

[Patent Document 1] Japanese Published Patent Application No. 2001-292276

DISCLOSURE OF INVENTION

In order to take an image of an object to be detected, incident light needs to be converted into an electric signal in a photosensor. In addition, the electric signal, which is an analog signal in general, needs to be converted into a digital signal by an A/D converter circuit.

Thus, an object of the present invention is to accurately convert incident light into an electric signal in a photosensor. Another object of the present invention is to provide a photosensor with a new circuit configuration for achieving the above object.

In the case of taking an image of an object to be detected which moves fast, there is a problem in that the image is likely to blur. An object of the present invention is also to solve that problem.

In order to take an image with high resolution, an A/D converter circuit is required to operate at high speed, leading to an increase in power consumption. Another object of the present invention is to solve that problem.

Also in order to take a color image with high resolution, an A/D converter circuit is required to operate at high speed, leading to an increase in power consumption. Still another object of the present invention is to solve that problem.

Moreover, in the case where faint light enters a photosensor, it is difficult to accurately convert the light into an electric signal. Still another object of the present invention is to solve that problem.

One embodiment of the present invention is a semiconductor device including a photosensor provided with a photodiode, a first transistor, and a second transistor. The photodiode has a function of supplying a charge corresponding to incident light to a gate of the first transistor, the first transistor has a function of accumulating the charge supplied to the gate, and the second transistor has a function of retaining the charge accumulated in the gate of the first transistor.

The second transistor preferably includes an oxide semiconductor.

The photodiode preferably includes a single crystal semiconductor.

The photosensor includes a third transistor that controls reading of an output signal of the first transistor.

Another embodiment of the present invention is a semiconductor device including a plurality of photosensors. The plurality of photosensors performs reset operation, accumulation operation, and selection operation, and performs the reset operation simultaneously, the accumulation operation simultaneously, and the selection operation in sequence. Thus, in the plurality of photosensors, the reset operation is performed at the same time, the accumulation operation is performed at the same time, and the selection operation is performed individually. The total time for the selection operation in all the photosensors is preferably longer than the time for the accumulation operation.

The semiconductor device also has a function of performing, after the reset operation, the accumulation operation and the selection operation a plurality of times repeatedly.

Another embodiment of the present invention is a semiconductor device including a plurality of photosensors and a light source of a certain color. The plurality of photosensors performs reset operation, accumulation operation, and selection operation, and simultaneously performs the reset operation for the certain color, simultaneously performs the accumulation operation for the certain color, and sequentially performs the selection operation. Thus, in the plurality of photosensors, the reset operation is performed at the same time, the accumulation operation is performed at the same time, and the selection operation is performed individually.

In the case where the certain color is a plurality of colors, the plurality of photosensors simultaneously performs reset operation for each of the plurality of colors, simultaneously performs accumulation operation for each of the plurality of colors, and sequentially performs selection operation. Thus, in the plurality of photosensors, the reset operation is performed at the same time for each color, the accumulation operation is performed at the same time for each color, and the selection operation is performed individually.

In the present invention, the reset operation is operation to initialize a photosensor, the accumulation operation is operation to accumulate a charge corresponding to incident light in a photosensor, and the selection operation is operation to output an electric signal from a photosensor (reading operation).

The semiconductor device refers to an element having a semiconductor property, and all the objects having the element. For example, a display device having a transistor is simply referred to as a semiconductor device in some cases.

Since one embodiment of the photosensor includes a transistor using an oxide semiconductor, incident light can be accurately converted into an electric signal.

In addition, since the accumulation operation is simultaneously performed in the plurality of photosensors, the accumulation operation can be completed in a short time, so that an image of an object to be detected can be taken with little blur even when the object moves fast.

Furthermore, a transistor controlling the accumulation operation includes an oxide semiconductor and thus has an extremely low off-current. Consequently, incident light can be accurately converted into an electric signal even when the number of photosensors increases and the selection operation requires longer time. Thus, an image with high resolution can be taken. Moreover, incident light can be accurately converted into an electric signal even when the number of photosensors and colors increases and the selection operation requires longer time. As a result, a color image with high resolution can be taken.

Moreover, faint light entering a photosensor can also be converted into an electric signal accurately.

Further, since the time for the selection operation can be increased, an A/D converter circuit does not necessarily operate at high speed, which results in a reduction in power consumption.

That is, an image with high resolution can be taken while the power consumption of the A/D converter circuit is reduced.

BRIEF DESCRIPTION OF DRAWINGS

In the accompanying drawings.

BEST MODE FOR CARRYING OUT THE INVENTION

Figure 1:
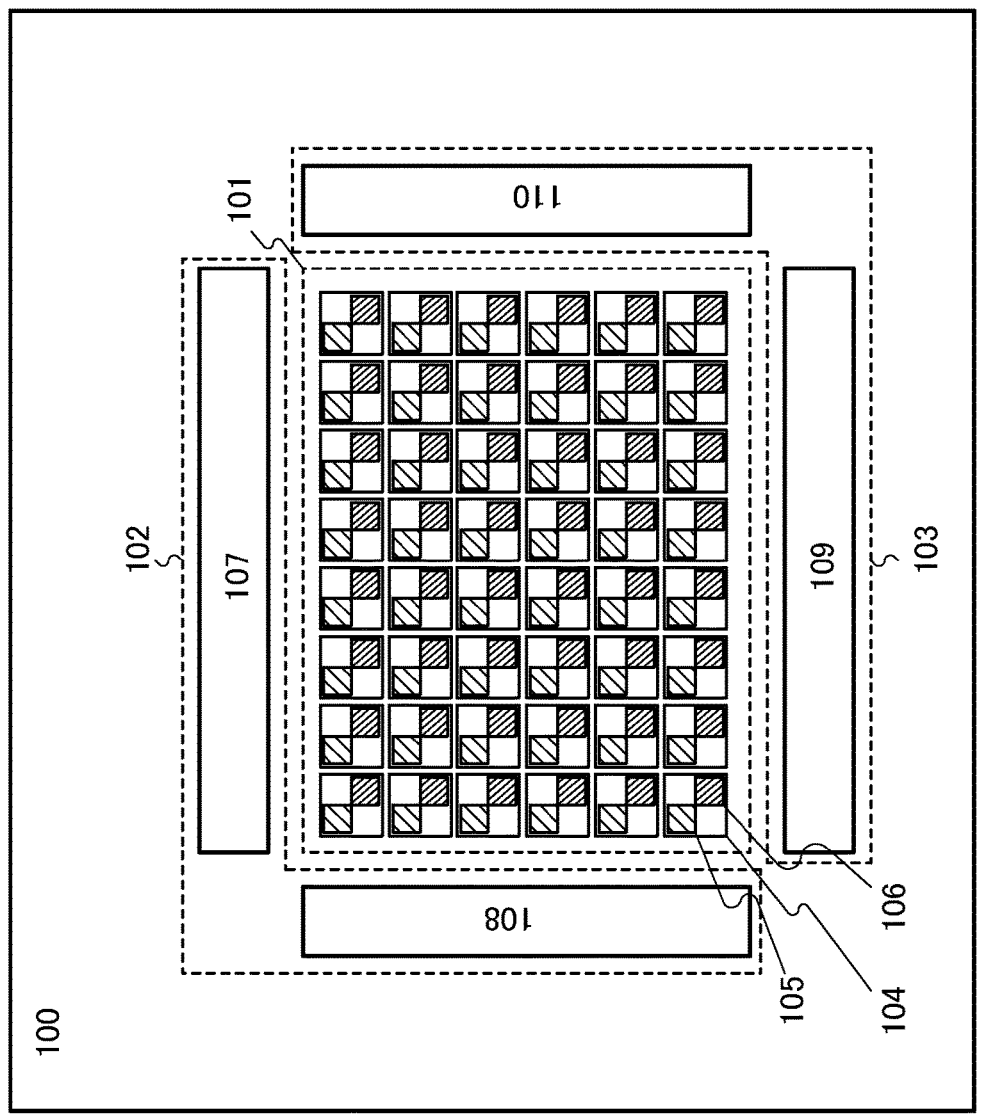
FIG. 1 illustrates an example of a display device.

Embodiments will be described in detail below with reference to drawings. Note that the following embodiments can be implemented in many different modes, and it is apparent to those skilled in the art that modes and details can be modified in various ways without departing from the spirit and scope of the present invention. Therefore, the present invention is not construed as being limited to the description of the embodiments. Note that in all the drawings for explaining the embodiments, like portions or portions having a similar function are denoted by like reference numerals, and the description thereof is omitted.

(Embodiment 1)

In this embodiment, a display device will be described with reference to FIG. 1, FIG. 2, and FIG. 3.

A structure of the display device will be described with reference to FIG. 1. A display panel 100 includes a pixel circuit 101, a display element control circuit 102, and a photosensor control circuit 103.

The pixel circuit 101 includes a plurality of pixels 104 arranged in matrix in a row direction and a column direction. Each of the pixels 104 includes a display element 105 and a photosensor 106. The photosensor is not necessarily provided in each of the pixels 104, and may be provided in every two or more pixels 104. Alternatively, the photosensor may be provided outside the pixels 104.

A circuit diagram of the pixel 104 will be described with reference to FIG. 2. The pixel 104 includes the display element 105 provided with a transistor 201, a storage capacitor 202, and a liquid crystal element 203; and the photosensor 106 provided with a photodiode 204 which is a light-receiving element, a transistor 205, a transistor 206, and a transistor 207.

In the display element 105, a gate of the transistor 201 is electrically connected to a gate signal line 208, one of a source and a drain of the transistor 201 is electrically connected to a video data signal line 212, and the other of the source and the drain is electrically connected to one electrode of the storage capacitor 202 and one electrode of the liquid crystal element 203. The other electrode of the storage capacitor 202 and the other electrode of the liquid crystal element 203 are each kept at a constant potential. The liquid crystal element 203 is an element including a pair of electrodes and a liquid crystal layer interposed between the pair of electrodes.

The transistor 201 has a function of controlling injection or release of charges to or from the storage capacitor 202. For example, when a high potential is applied to the gate signal line 208, the potential of the video data signal line 212 is applied to the storage capacitor 202 and the liquid crystal element 203. The storage capacitor 202 has a function of retaining a charge corresponding to a voltage applied to the liquid crystal element 203. The contrast (gray scale) of light passing through the liquid crystal element 203 is made by utilizing the change in the polarization direction due to voltage application to the liquid crystal element 203, whereby image display is realized. As the light passing through the liquid crystal element 203, light emitted from a light source (a backlight) on the back surface of the liquid crystal display device is used.

For the transistor 201, an amorphous semiconductor, a microcrystal semiconductor, a polycrystalline semiconductor, an oxide semiconductor, a single crystal semiconductor, or the like can be used. In particular, display quality can be increased by using an oxide semiconductor to obtain a transistor with an extremely low off-current.

Although the display element 105 described here includes the liquid crystal element, the display element 105 may include other elements such as a light-emitting element. The light-emitting element is an element whose luminance is controlled with current or voltage, and specific examples thereof are a light-emitting diode and an OLED (organic light-emitting diode).

In the photosensor 106, one electrode of the photodiode 204 is electrically connected to a photodiode reset signal line 210, and the other electrode thereof is electrically connected to one of a source and a drain of the transistor 207. One of a source and a drain of the transistor 205 is electrically connected to a photosensor reference signal line 213, and the other of the source and the drain is electrically connected to one of a source and a drain of the transistor 206. A gate of the transistor 206 is electrically connected to a gate signal line 211, and the other of the source and the drain of the transistor 206 is electrically connected to a photosensor output signal line 214. A gate of the transistor 207 is electrically connected to a gate signal line 209, and the other of the source and the drain of the transistor 207 is electrically connected to a gate of the transistor 205.

For the photodiode 204, an amorphous semiconductor, a microcrystal semiconductor, a polycrystalline semiconductor, an oxide semiconductor, a single crystal semiconductor, or the like can be used. In particular, a single crystal semiconductor (e.g., single crystal silicon) with few crystal defects is preferably used so as to improve the proportion of an electric signal generated from incident light (the quantum efficiency). As the semiconductor material, it is preferable to use silicon semiconductor such as silicon or silicon germanium, the crystallinity of which can be easily increased.

For the transistor 205, an amorphous semiconductor, a microcrystal semiconductor, a polycrystalline semiconductor, an oxide semiconductor, a single crystal semiconductor, or the like can be used. In particular, a single crystal semiconductor is preferably used for the transistor 205 so that the transistor 205 has high mobility and has a function of converting a charge supplied from the photodiode 204 into an output signal. As the semiconductor material, it is preferable to use silicon semiconductor such as silicon or silicon germanium, the crystallinity of which can be easily increased.

For the transistor 206, an amorphous semiconductor, a microcrystal semiconductor, a polycrystalline semiconductor, an oxide semiconductor, a single crystal semiconductor, or the like can be used. In particular, a single crystal semiconductor is preferably used for the transistor 206 so that the transistor 206 has high mobility and has a function of supplying an output signal of the transistor 205 to the photosensor output signal line 214. As the semiconductor material, it is preferable to use silicon semiconductor such as silicon or silicon germanium, the crystallinity of which can be easily increased.

For the transistor 207, an amorphous semiconductor, a microcrystal semiconductor, a polycrystalline semiconductor, an oxide semiconductor, a single crystal semiconductor, or the like can be used. In particular, an oxide semiconductor is preferably used for the transistor 207 so that the transistor 207 has an extremely low off-current and has a function of retaining a charge of the gate of the transistor 205. When plural kinds of transistors are thus disposed in accordance with the functions necessary for the transistors, the performance of the photosensor can be improved.

The display element control circuit 102 is a circuit for controlling the display element 105, and includes a display element driver circuit 107 from which a signal is input to the display element 105 through a signal line (also referred to as a source signal line) such as the video data signal line; and a display element driver circuit 108 from which a signal is input to the display element 105 through a scan line (also referred to as a gate signal line). For example, the display element driver circuit 108 electrically connected to the scan line has a function of selecting a display element included in a pixel in a specified row. The display element driver circuit 107 electrically connected to the signal line has a function of supplying a predetermined potential to a display element included in a pixel in a selected row. Note that in the display element connected to the gate signal line to which a high potential is applied from the display element driver circuit 108, the transistor is turned on and supplied with a potential applied to the video data signal line from the display element driver circuit 107.

The photosensor control circuit 103 is a circuit for controlling the photosensor 106, and includes a photosensor reading circuit 109 electrically connected to the signal line such as the photosensor output signal line or the photosensor reference signal line; and a photosensor driver circuit 110 electrically connected to the scan line.

The photosensor driver circuit 110 has a function of performing the hereinafter described reset operation, accumulation operation, and selection operation on the photosensor 106 included in a pixel in a specified row.

The photosensor reading circuit 109 has a function of extracting an output signal of the photosensor 106 included in a pixel in a selected row. Note that from the photosensor reading circuit 109, an output of the photosensor 106, which is an analog signal, is extracted as it is to the outside of the display panel with the use of an OP amplifier. Alternatively, the output of the photosensor 106 is converted into a digital signal with the use of an A/D converter circuit and then extracted to the outside of the display panel.

A precharge circuit included in the photosensor reading circuit 109 will be described with reference to FIG. 2. In FIG. 2, a precharge circuit 200 for one column of pixels includes a transistor 216 and a precharge signal line 217. Note that the photosensor reading circuit 109 may include an OP amplifier or an A/D converter circuit connected to a subsequent stage of the precharge circuit 200.

In the precharge circuit 200, before the operation of the photosensor in the pixel, the potential of the photosensor output signal line 214 is set to a reference potential. In FIG. 2, the precharge signal line 217 is set to "L (Low)" so that the transistor 216 is turned on, whereby the potential of the photosensor output signal line 214 can be set to a reference potential (here, a high potential). Note that it is effective to provide a storage capacitor for the photosensor output signal line 214 so that the potential of the photosensor output signal line 214 is stabilized. Note that the reference potential may be set to a low potential. In that case, the conductivity type of the transistor 216 is made opposite to that of FIG. 2 and the precharge signal line 217 is set to "H (High)", whereby the potential of the photosensor output signal line 214 can be set to a reference potential.

Next, the operation of the photosensor 106 will be described with reference to the timing chart of FIG. 3. In FIG. 3, a signal 301, a signal 302, a signal 303, a signal 304, a signal 305, and a signal 306 correspond to the potentials of the photodiode reset signal line 210, the gate signal line 209, the gate signal line 211, the gate signal line 215, the photosensor output signal line 214, and the precharge signal line 217, respectively.

At time A, the potential of the photodiode reset signal line 210 (the signal 301) is set to "H" and the potential of the gate signal line 209 (the signal 302) is set to "H" (reset operation is started); then, the photodiode 204 is turned on and the potential of the gate signal line 215 (the signal 304) becomes "H". When the potential of the precharge signal line 217 (the signal 306) is "L", the potential of the photosensor output signal line 214 (the signal 305) is precharged to "H".

At time B, the potential of the photodiode reset signal line 210 (the signal 301) is set to "L" and the potential of the gate signal line 209 (the signal 302) is kept at "H" (the reset operation is completed and accumulation operation is started); then, the potential of the gate signal line 215 (the signal 304) is started to be lowered because of the off-current of the photodiode 204. Since the off-current of the photodiode 204 increases as light enters, the potential of the gate signal line 215 (the signal 304) changes depending on the amount of incident light. In other words, the photodiode 204 has a function of supplying a charge in accordance with the incident light to the gate of the transistor 205. Then, the channel resistance between the source and the drain of the transistor 205 changes.

At time C, the potential of the gate signal line 209 (the signal 302) is set to "L" (the accumulation operation is completed); then, the potential of the gate signal line 215 (the signal 304) becomes constant. This potential is determined by the charge that has been supplied to the gate signal line 215 from the photodiode 204 during the accumulation operation. That is, the amount of charge accumulated in the gate of the transistor 205 changes depending on the light entering the photodiode 204. In addition, the transistor 207 uses an oxide semiconductor so as to have an extremely low off-current; consequently, the accumulated charge can be kept constant until the subsequent selection operation.

At time D, the potential of the gate signal line 211 (the signal 303) is set to "H" (the selection operation is started); then, the transistor 206 is turned on and electrical conduction is established between the photosensor reference signal line 213 and the photosensor output signal line 214 through the transistor 205 and the transistor 206. Then, the potential of the photosensor output signal line 214 (the signal 305) is lowered. Note that before the time D, the potential of the precharge signal line 217 (the signal 306) is set to "H" so that the precharge of the photosensor output signal line 214 is completed. Here, the rate at which the potential of the photosensor output signal line 214 (the signal 305) is lowered depends on the current between the source and the drain of the transistor 205, namely, the amount of light irradiated to the photodiode 204 during the accumulation operation.

At time E, the potential of the gate signal line 211 (the signal 303) is set to "L" (the selection operation is completed); then, the transistor 206 is turned off and the potential of the photosensor output signal line 214 (the signal 305) becomes constant. The constant value here changes depending on the amount of light irradiated to the photodiode 204. Thus, the amount of light entering the photodiode 204 during the accumulation operation can be determined by obtaining the potential of the photosensor output signal line 214.

In the above manner, the operation of individual photosensors is realized by repeatedly performing the reset operation, the accumulation operation, and the selecting operation. The transistor 207 controlling the accumulation operation preferably uses an oxide semiconductor to have an extremely low off-current as described above. With such a circuit configuration, the function of retaining the charge accumulated in the gate of the transistor 205 can be improved. Accordingly, incident light can be accurately converted into an electric signal in the photosensor 106.

Although the display device including the photosensor is described in this embodiment, this embodiment can be easily applied to a semiconductor device including the photosensor. That is, a semiconductor device can be formed by removing circuits necessary for display, specifically the display element control circuit 102 and the display element 105, from the display device in this embodiment. An example of the semiconductor device is an image sensor.

This embodiment can be implemented in appropriate combination with the other embodiments.

(Embodiment 2)

In this embodiment, a method for driving a plurality of photosensors will be described.

Figure 4:
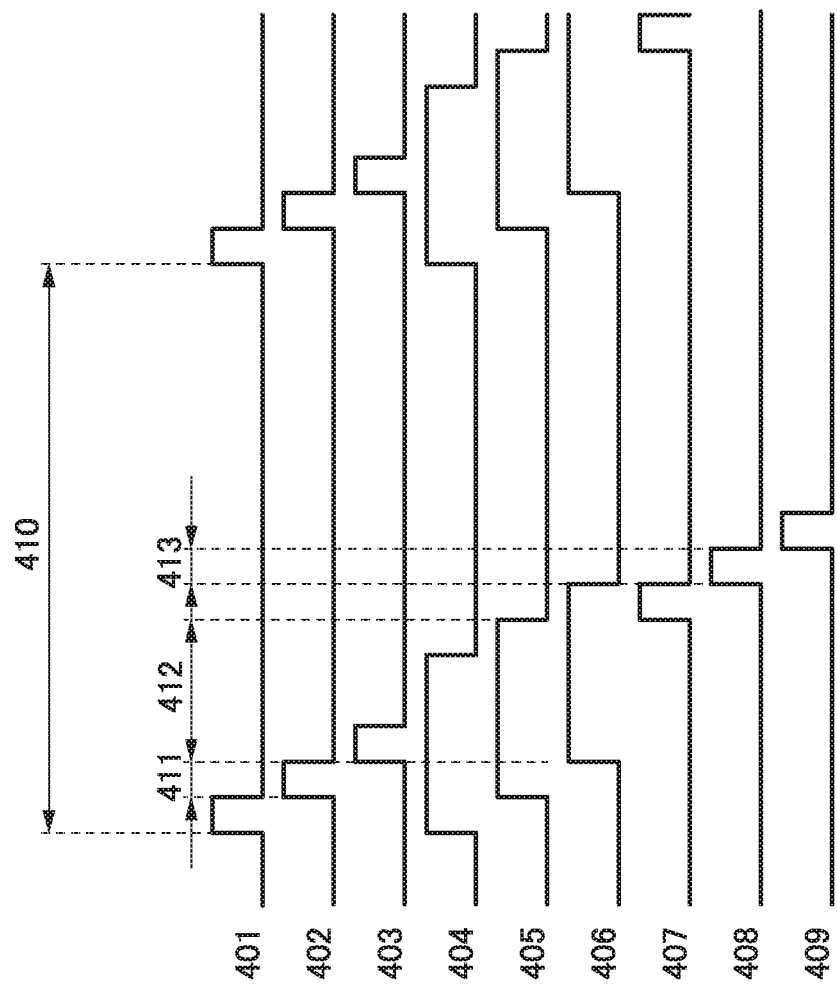
FIG. 4 is a timing chart.

First, a driving method illustrated in the timing chart of FIG. 4 is described. In FIG. 4, a signal 401, a signal 402, and a signal 403 are signals showing a potential change of the photodiode reset signal line 210 in a photosensor of the first row, the second row, and the third row, respectively. A signal 404, a signal 405, and a signal 406 are signals showing a potential change of the gate signal line 209 in the photosensor of the first row, the second row, and the third row, respectively. A signal 407, a signal 408, and a signal 409 are signals showing a potential change of the gate signal line 211 in the photosensor of the first row, the second row, and the third row, respectively. A period 410 is a period required for one imaging. A period 411 is a period during which the reset operation is performed in the photosensor of the second row, a period 412 is a period during which the accumulation operation is performed in the photosensor of the second row, and a period 413 is a period during which the selection operation is performed in the photosensor of the second row. By thus sequentially driving the photosensor of each row, images can be taken.

It is found here that the accumulation operation in the photosensor of each row has a time lag. That is, imaging in the photosensor of each row is not performed simultaneously, leading to blurring of the image taken. In particular, an image of an object to be detected which moves fast is easily taken to have a distorted shape: if the object to be detected moves in a direction from the first row to the third row, an enlarged image is taken leaving a trail behind it; and if the object to be detected moves in the opposite direction, a reduced image is taken.

In order to prevent the time lag of the accumulation operation in the photosensor of each row, it is effective that the photosensor of each row is sequentially driven in a shorter cycle. In that case, however, the output signal of the photosensor needs to be obtained at very high speed with an OP amplifier or an AD converter circuit, which causes an increase in power consumption, and makes it very difficult to obtain an image with high resolution, in particular.

Figure 5:
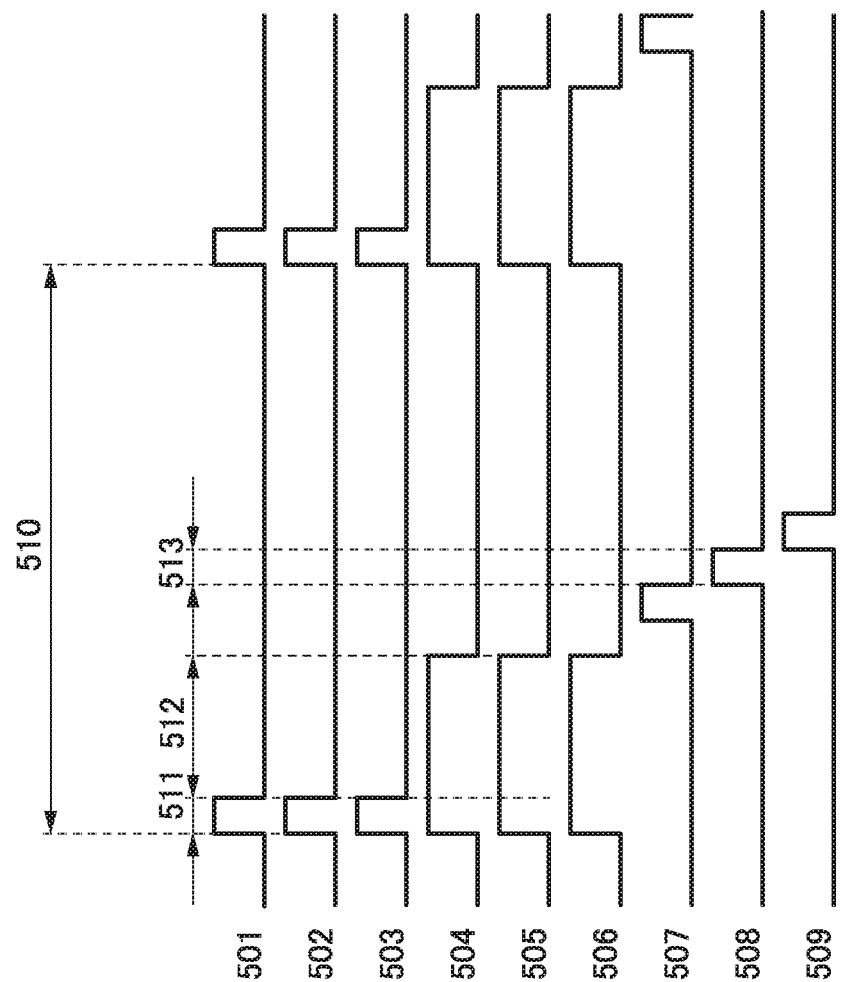
FIG. 5 is a timing chart.

Thus, a driving method illustrated in the timing chart of FIG. 5 is proposed. In FIG. 5, a signal 501, a signal 502, and a signal 503 are signals showing a potential change of the photodiode reset signal line 210 in the photosensor of the first row, the second row, and the third row, respectively. A signal 504, a signal 505, and a signal 506 are signals showing a potential change of the gate signal line 209 in the photosensor of the first row, the second row, and the third row, respectively. A signal 507, a signal 508, and a signal 509 are signals showing a potential change of the gate signal line 211 in the photosensor of the first row, the second row, and the third row, respectively. A period 510 is a period required for one imaging. A period 511 is a period during which the reset operation (at the same time in all the rows) is performed in the photosensor of the second row, a period 512 is a period during which the accumulation operation (at the same time in all the rows) is performed in the photosensor of the second row, and a period 513 is a period during which the selection operation is performed in the photosensor of the second row.

FIG. 5 is different from FIG. 4 in that the reset operation and the accumulation operation are each performed in the same period in the photosensors of all the rows, and after the accumulation operation, the selection operation is sequentially performed in each row without synchronization with the accumulation operation. When the accumulation operation is performed in the same period, imaging in the photosensor of each row is performed simultaneously and an image of an object to be detected can be easily taken with little blur even when the object moves fast. Since the accumulation operation is performed at the same time, a driver circuit can be provided in common for the photodiode reset signal line 210 of each photosensor. Further, a driver circuit can also be provided in common for the gate signal line 209 of each photosensor. Such driver circuits provided in common are effective in reducing the number of peripheral circuits or reducing power consumption. In addition, the selection operation sequentially performed in each row makes it possible to lower the operation rate of an OP amplifier or an A/D converter circuit when the output signal of the photosensor is obtained. At this time, the total time for the selection operation is preferably longer than the time for the accumulation operation, which is particularly effective in the case of obtaining an image with high resolution.

Note that FIG. 5 illustrates the timing chart of the method for sequentially driving the photosensor of each row; it is also effective to sequentially drive the photosensor only in a certain row in order to obtain an image in a specified region. As a result, a desired image can be obtained while the operation and power consumption of the OP amplifier or the A/D converter circuit are reduced. Further, a method for driving the photosensor of every few rows, namely, some of a plurality of photosensors, is also effective. As a result, an image with desired resolution can be obtained while the operation and power consumption of the OP amplifier or the A/D converter circuit are reduced.

In order to realize the aforementioned driving method, the potential of the gate signal line 215 in each photosensor needs to be kept constant even after the accumulation operation is completed. Thus, the transistor 207 preferably uses an oxide semiconductor to have an extremely low off-current as described in FIG. 2.

In the aforementioned manner, it is possible to provide a low-power consumption display device or semiconductor device which allows a high-resolution of an object to be detected to be taken image with little blur even when the object moves fast.

This embodiment can be implemented in appropriate combination with the other embodiments.

(Embodiment 3)

In this embodiment, a method for driving a plurality of photosensors, which is an example different from that in Embodiment 2, will be described.

Figure 10:
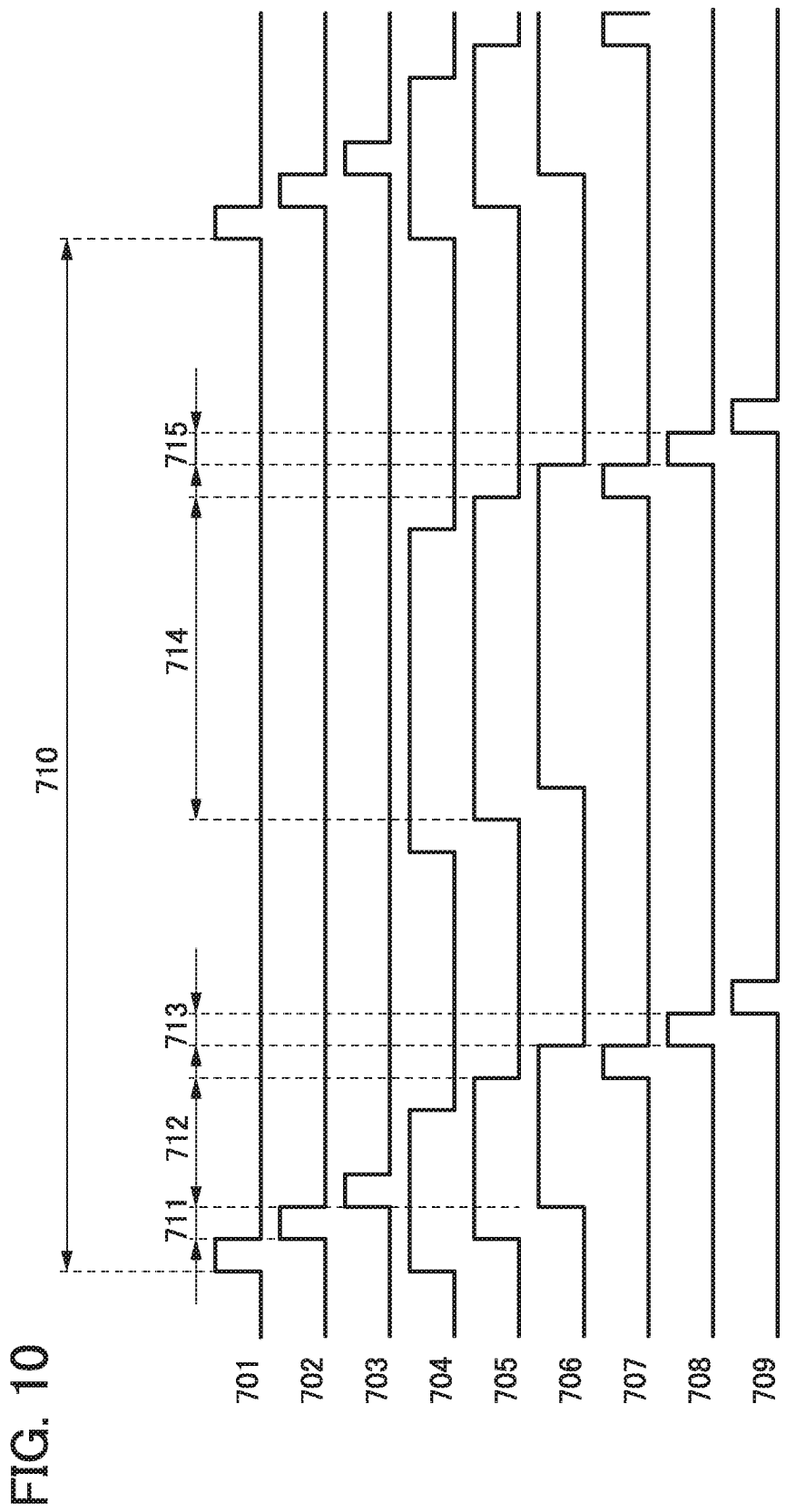
FIG. 10 is a timing chart.

First, a driving method illustrated in the timing chart of FIG. 10 is described. In FIG. 10, a signal 701, a signal 702, and a signal 703 are signals showing a potential change of the photodiode reset signal line 210 in a photosensor of the first row, the second row, and the third row, respectively. A signal 704, a signal 705, and a signal 706 are signals showing a potential change of the gate signal line 209 in the photosensor of the first row, the second row, and the third row, respectively. A signal 707, a signal 708, and a signal 709 are signals showing a potential change of the gate signal line 211 in the photosensor of the first row, the second row, and the third row, respectively. A period 710 is a period required for one imaging. A period 711 is a period during which reset operation is performed in the photosensor of the second row, a period 712 is a period during which first accumulation operation is performed in the photosensor of the second row, a period 713 is a period during which first selection operation is performed in the photosensor of the second row, a period 714 is a period during which second accumulation operation is performed in the photosensor of the second row, and a period 715 is a period during which second selection operation is performed in the photosensor of the second row. By performing the second selection operation, it is possible to find the amount of light entering the photodiode 204 in a period from the starting of the first accumulation operation to the end of the second accumulation operation. Consequently, even faint light can be accurately converted into an electric signal by repeatedly performing the accumulation operation and the selection operation a plurality of times. By thus sequentially driving the photosensor of each row, images can be taken.

In the timing chart of FIG. 10, it is found that the first accumulation operation and the second accumulation operation in the photosensor of each row have a time lag. That is, imaging in the photosensor of each row is not performed simultaneously, leading to blurring of the image taken. In particular, an image of an object to be detected which moves fast is easily taken to have a distorted shape: if the object to be detected moves in a direction from the first row to the third row, an enlarged image is taken leaving a trail behind it; and if the object to be detected moves in the opposite direction, a reduced image is taken.

In order to prevent the time lag of the first accumulation operation and the second accumulation operation in the photosensor of each row, it is effective that the photosensor of each row is sequentially driven in a shorter cycle. In that case, however, the output signal of the photosensor needs to be obtained at very high speed with an OP amplifier or an AD converter circuit, which causes an increase in power consumption, and makes it very difficult to obtain an image with high resolution, in particular.

Figure 11:
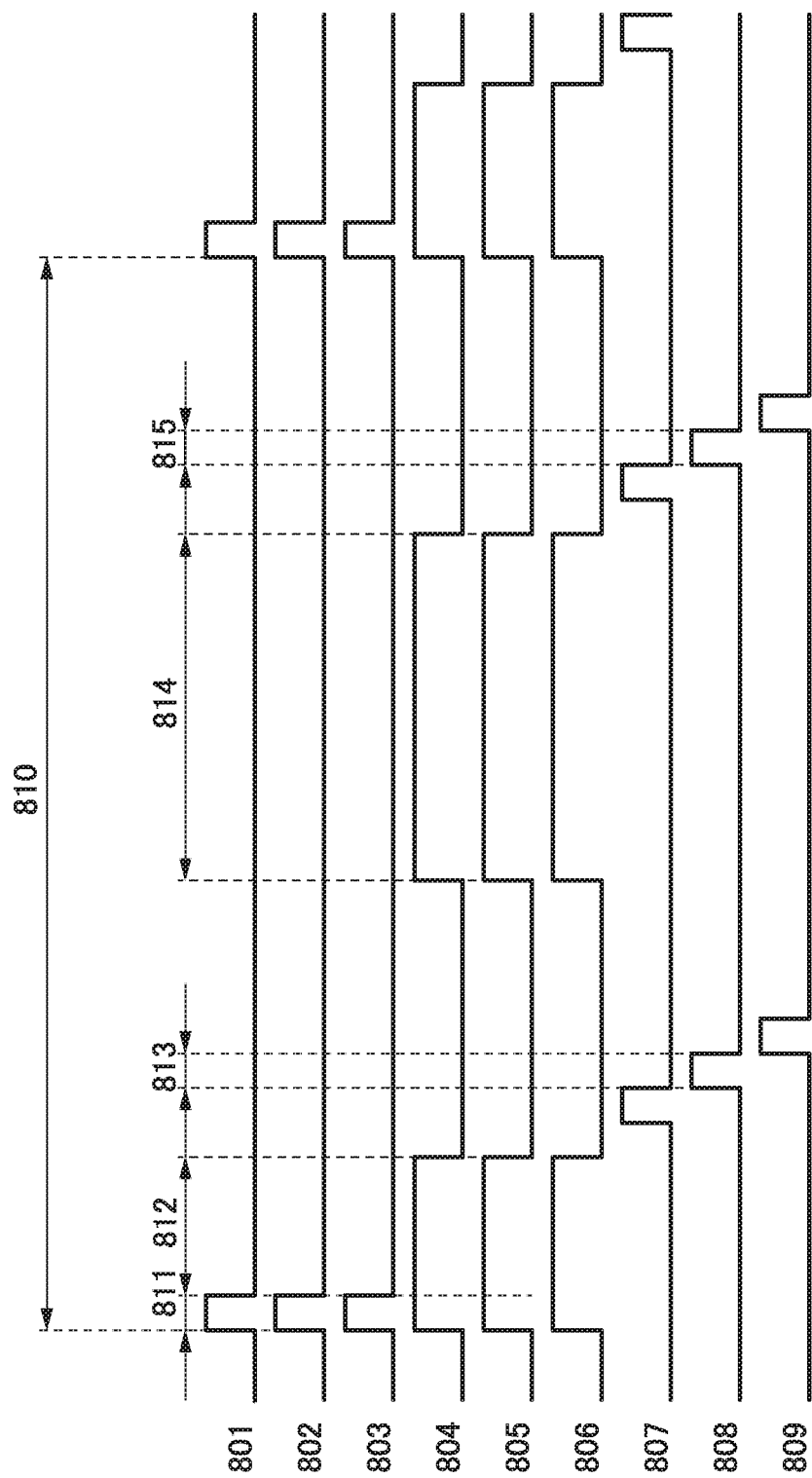
FIG. 11 is a timing chart.

Thus, a driving method illustrated in the timing chart of FIG. 11 is proposed. In FIG. 11, a signal 801, a signal 802, and a signal 803 are signals showing a potential change of the photodiode reset signal line 210 in a photosensor of the first row, the second row, and the third row, respectively. A signal 804, a signal 805, and a signal 806 are signals showing a potential change of the gate signal line 209 in the photosensor of the first row, the second row, and the third row, respectively. A signal 807, a signal 808, and a signal 809 are signals showing a potential change of the gate signal line 211 in the photosensor of the first row, the second row, and the third row, respectively. A period 810 is a period required for one imaging. A period 811 is a period during which reset operation (at the same time in all the rows) is performed in the photosensor of the second row, a period 812 is a period during which first accumulation operation (at the same time in all the rows) is performed in the photosensor of the second row, a period 813 is a period during which first selection operation is performed in the photosensor of the second row, a period 814 is a period during which second accumulation operation (at the same time in all the rows) is performed in the photosensor of the second row, and a period 815 is a period during which second selection operation is performed in the photosensor of the second row.

FIG. 11 is different from FIG. 10 in that the reset operation, the first accumulation operation, and the second accumulation operation are each performed in the same period in the photosensors of all the rows, and after the first accumulation operation, the first selection operation is sequentially performed in each row without synchronization with the first accumulation operation, and after the second accumulation operation, the second selection operation is sequentially performed in each row without synchronization with the second accumulation operation. When the first accumulation operation and the second accumulation operation are each performed in the same period, imaging in the photosensor of each row is performed simultaneously and an image of an object to be detected can be easily taken with little blur even when the object moves fast. Since the accumulation operation is performed at the same time, a driver circuit can be provided in common for the photodiode reset signal line 210 of each photosensor. Further, a driver circuit can also be provided in common for the gate signal line 209 of each photosensor. Such driver circuits provided in common are effective in reducing the number of peripheral circuits or reducing power consumption. In addition, since the first selection operation is performed without synchronization with the first accumulation operation and the second selection operation is performed without synchronization with the second accumulation operation, the operation rate of an OP amplifier or an A/D converter circuit can be further reduced when the output signal of the photosensor is obtained. At this time, the total time for the selection operation is preferably longer than the time from the starting of the first accumulation operation to the end of the second accumulation operation, which is particularly effective in the case of obtaining an image with high resolution from faint light.

Note that FIG. 11 illustrates the timing chart of the method for sequentially driving the photosensor of each row; it is also effective to sequentially drive the photosensor only in a certain row in order to obtain an image in a specified region. As a result, a desired image can be obtained while the operation and power consumption of the OP amplifier or the A/D converter circuit are reduced. Further, a method for driving the photosensor of every few rows, namely, some of a plurality of photosensors, is also effective. As a result, an image with desired resolution can be obtained while the operation and power consumption of the OP amplifier or the A/D converter circuit are reduced.

In order to realize the aforementioned driving method, the potential of the gate signal line 215 in each photosensor needs to be kept constant even after the accumulation operation is completed. Thus, the transistor 207 preferably uses an oxide semiconductor to have an extremely low off-current as described in FIG. 2.

Although the display device including the photosensor is described in this embodiment, this embodiment can be easily applied to a semiconductor device including the photosensor. That is, a semiconductor device can be formed by removing circuits necessary for display, specifically the display element control circuit 102 and the display element 105, from the display device in this embodiment.

In the aforementioned manner, it is possible to provide a low-power consumption display device or semiconductor device which allows an image of an object to be detected to be taken with little blur even when the object moves fast and which allows a high resolution image to be taken even when faint light enters.

This embodiment can be implemented in appropriate combination with the other embodiments.

(Embodiment 4)

In this embodiment, a method for taking a color image with the use of a plurality of photosensors will be described.

A color image can be taken by using, for example, a color filter, a so-called color filter method. In this method, light emitted to an object to be detected or light reflected by the object to be detected passes through a color filter and enters a photodiode as light of a certain color (e.g., red (R), green (G), or blue (B)), whereby the amount of light of each color can be found. A color gradation image can be produced in accordance with the amount of light of each color.

In the color filter method, however, the amount of light emitted to an object to be detected or light reflected by the object to be detected is significantly reduced when the light passes through a color filter. Accordingly, in order to obtain a sufficient amount of light entering a photodiode, more intense light needs to be emitted to the object to be detected, which causes a considerable increase in the power consumption of a display device. In addition, the photodiode is required to have much higher performance, leading to an increase in manufacturing cost.

Thus, in this embodiment, a field sequential method is used. Reset operation and accumulation operation are performed while light of a certain color (e.g., red (R), green (G), or blue (B)) is emitted from a light source (a backlight), so that light of the color reflected by an object to be detected is detected by a photosensor. After the accumulation operation of each color is completed, selection operation is sequentially performed in all photosensors, whereby a color image can be taken.

Such a driving method is described with reference to the timing chart of FIG. 5. A difference from Embodiment 2 is that a specified color (here, red (R)) is detected by a photosensor of each row. That is, the signal 501, the signal 502, and the signal 503 are signals showing a potential change of the photodiode reset signal line 210 in a photosensor for detecting red (R) light. The signal 504, the signal 505, and the signal 506 are signals showing a potential change of the gate signal line 209 in the photosensor for detecting red (R) light. The signal 507, the signal 508, and the signal 509 are signals showing a potential change of the gate signal line 211 in the photosensor for detecting red (R) light. The period 510 is the period required for one imaging of red (R) light. The period 511 is a period during which the reset operation (at the same time in all the rows) is performed in the photosensor for detecting red (R) light, the period 512 is a period during which the accumulation operation (at the same time in all the rows) is performed in the photosensor for detecting red (R) light, and the period 513 is a period during which the selection operation is performed in the photosensor for detecting red (R) light.

FIG. 5 is characterized in that the reset operation and the accumulation operation are each performed in the same period in the photosensors for detecting red (R) of all the rows, and after the accumulation operation, the selection operation is sequentially performed in each row without synchronization with the accumulation operation. When the accumulation operation is performed in the same period, imaging in the photosensor for detecting red (R) of each row is performed simultaneously and an image of an object to be detected can be easily taken with little blur even when the object moves fast. Since the accumulation operation is performed at the same time, a driver circuit can be provided in common for the photodiode reset signal line 210 of each photosensor. Further, a driver circuit can also be provided in common for the gate signal line 209 of each photosensor. Such driver circuits provided in common are effective in reducing the number of peripheral circuits or reducing power consumption.

In addition, the selection operation sequentially performed in each row makes it possible to lower the operation rate of an OP amplifier or an A/D converter circuit when the output signal of the photosensor is obtained. At this time, the total time for the selection operation is preferably longer than the total time for the accumulation operation, which is particularly effective in the case of obtaining an image with high resolution.

When the above driving method is applied to other specified colors (e.g., green (G) or blue (B)), an image of plural colors can be taken. In the case of taking an image of plural colors, the total time for the accumulation operation is increased; therefore, imaging time can be reduced by employing the aforementioned structure in which the accumulation operation is performed simultaneously. Note that there is no limitation on the order of colors on which each operation is performed.

Note that FIG. 5 illustrates the timing chart of the method for sequentially driving the photosensor for detecting a certain color (e.g., red (R), green (G), or blue (B)) of each row; it is also effective to sequentially drive the photosensor only in a certain row in order to obtain an image in a specified region. As a result, a desired image can be obtained while the operation and power consumption of the OP amplifier or the A/D converter circuit are reduced. Further, a method for driving the photosensor of every few rows is also effective. As a result, an image with desired resolution can be obtained while the operation and power consumption of the OP amplifier or the A/D converter circuit are reduced.

In order to realize the aforementioned driving method, the potential of the gate signal line 215 in each photosensor needs to be kept constant even after the accumulation operation is completed. Thus, the transistor 207 preferably uses an oxide semiconductor to have an extremely low off-current as described in FIG. 2.

In the driving method illustrated in FIG. 5, the selection operation may be performed after the reset operation and the accumulation operation are performed in all the photosensors for detecting the specified colors (e.g., red (R), green (G), and blue (B)) of each row. For example, one imaging is performed in the following order: the reset operation and accumulation operation of red (R), the reset operation and accumulation operation of green (G), the reset operation and accumulation operation of blue (B), the selection operation of red (R), the selection operation of green (G), and the selection operation of blue (B). There is no limitation on the order of colors on which each operation is performed.

Since the accumulation operation of all the colors is performed in a short time, simultaneity of imaging in the photosensors for detecting all the colors is ensured and an image of an object to be detected can be easily taken with little blur even when the object moves fast. Further, a driver circuit can be provided in common for driving the photodiode reset signal line 210 of the photosensor for detecting each color, and a driver circuit can be provided in common for driving the gate signal line 209 of the photosensor for detecting each color, which is effective in reducing the number of peripheral circuits or reducing power consumption. In addition, since the selection operation is performed without synchronization with the accumulation operation, the operation rate of an OP amplifier or an A/D converter circuit can be further reduced when the output signal of the photosensor is obtained, which is particularly effective in the case of obtaining a color image with high resolution.

Although the display device including the photosensor is described in this embodiment, this embodiment can be easily applied to a semiconductor device including the photosensor. The backlight corresponds to an imaging auxiliary light source such as a flashlight in the case where an image is taken with a semiconductor device such as a digital still camera or a cellular phone.

In the aforementioned manner, it is possible to provide a low-power consumption display device or semiconductor device which allows a high-resolution color image of an object to be detected to be taken with little blur even when the object moves fast.

This embodiment can be implemented in appropriate combination with the other embodiments.

(Embodiment 5)

In this embodiment, a modified example of the circuit configuration of the photosensor 106 in FIG. 2 will be described.

Figure 2:
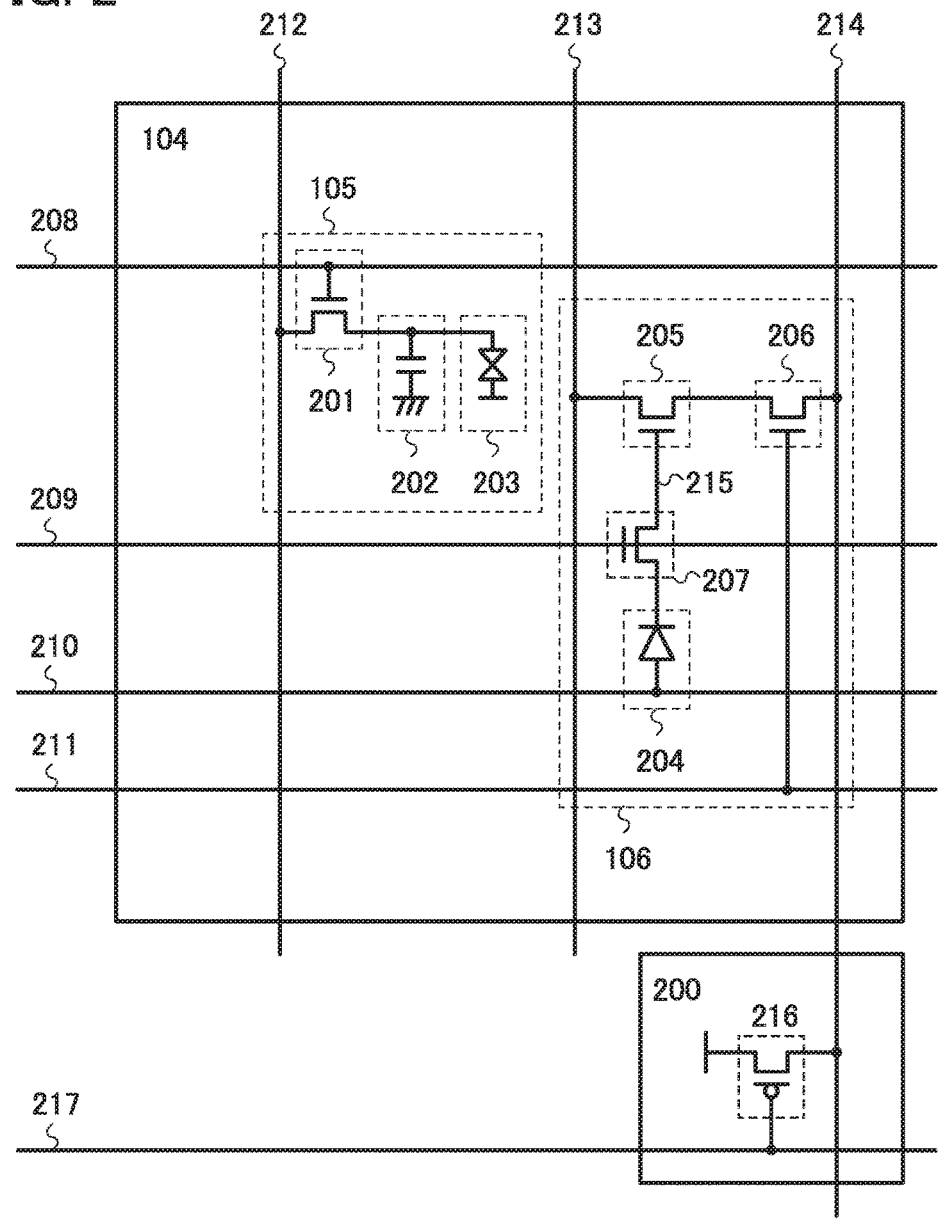
FIG. 2 illustrates an example of a display device.
Figure 3:
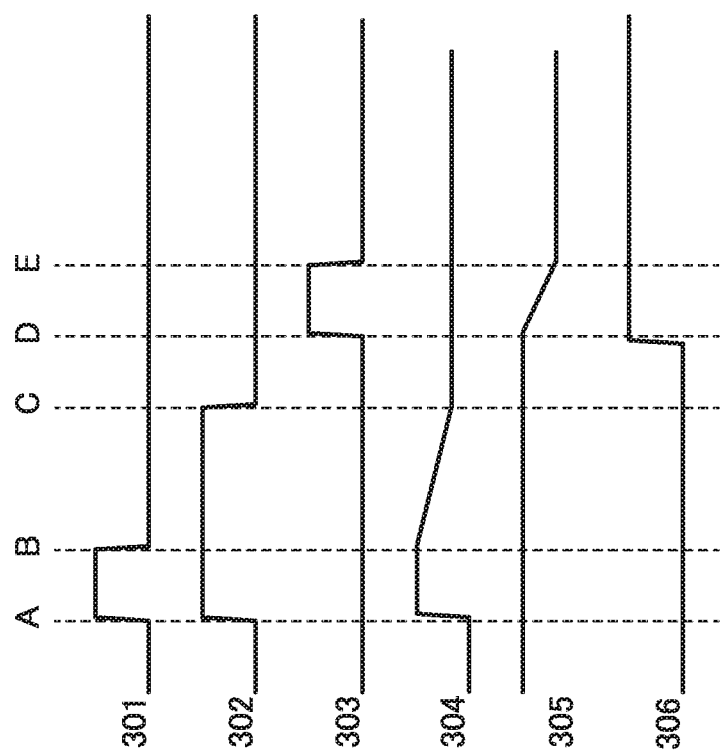
FIG. 3 is a timing chart.
Figure 6A:
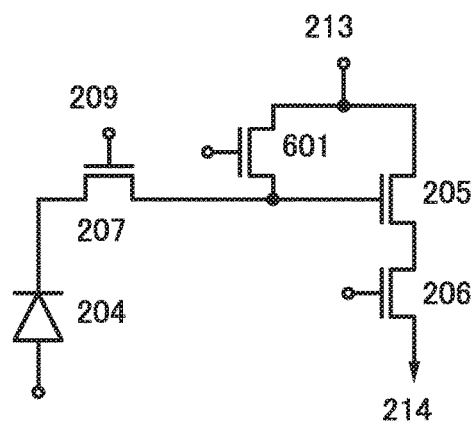
FIGS. 6A to 6D illustrate examples of a photosensor.

FIG. 6A illustrates a configuration in which the gate of the transistor 205 in FIG. 2 is connected to a transistor 601 for controlling the reset operation of the photosensor. Specifically, one of a source and a drain of the transistor 601 is electrically connected to the photosensor reference signal line 213 and the other thereof is electrically connected to the gate of the transistor 205. One electrode of the photodiode 204 is electrically connected to a wiring to which a predetermined potential (e.g., a ground potential) is applied.

For the transistor 601, an amorphous semiconductor, a microcrystal semiconductor, a polycrystalline semiconductor, an oxide semiconductor, a single crystal semiconductor, or the like can be used. In particular, an oxide semiconductor is preferably used for the transistor 601 so that the transistor 601 has a low off-current and a charge of the gate of the transistor 205 is prevented from being released through the transistor 601 after the reset operation.

Figure 6B:
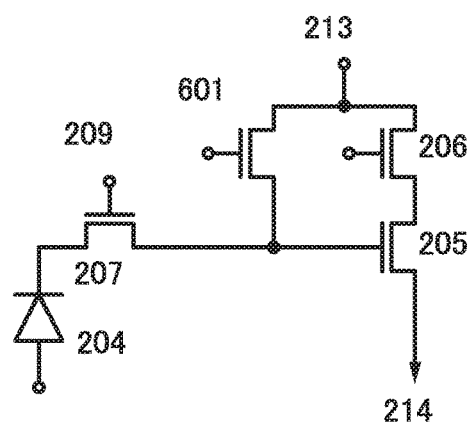

FIG. 6B illustrates a configuration in which the transistor 205 and the transistor 206 are connected in a manner opposite to that in FIG. 6A. Specifically, one of the source and the drain of the transistor 205 is electrically connected to the photosensor output signal line 214, and one of the source and the drain of the transistor 206 is electrically connected to the photosensor reference signal line 213.

Figure 6C:
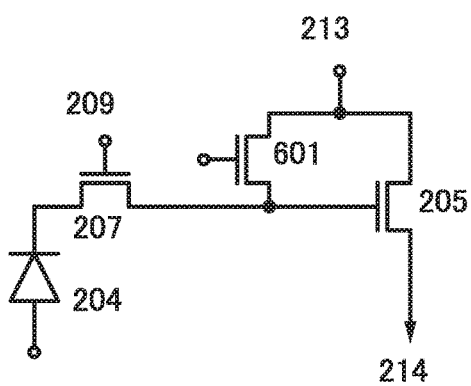

FIG. 6C illustrates a configuration in which the transistor 206 is omitted from the configuration in FIG. 6A. Specifically, one of the source and the drain of the transistor 205 is electrically connected to the photosensor reference signal line 213 and the other thereof is electrically connected to the photosensor output signal line 214.

Note that in FIGS. 6A to 6C, one of the source and the drain of the transistor 601 may be electrically connected to a wiring different from the photosensor reference signal line 213.

Figure 6D:
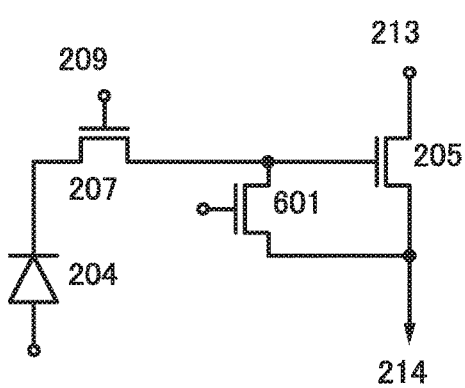

In FIG. 6D, one of the source and the drain of the transistor 601 in FIG. 6C is electrically connected to the photosensor output signal line 214 and the other thereof is electrically connected to the gate of the transistor 205.

In FIGS. 6A to 6D, when the transistor 207 uses an oxide semiconductor to have a lower off-current, the charge accumulated in the gate of the transistor 205 can be kept constant.

In FIGS. 6A to 6D, the two electrodes of the photodiode 204 may be connected in a manner opposite to each other depending on the circuit configuration of the photosensor.

This embodiment can be implemented in appropriate combination with the other embodiments.

(Embodiment 6)

Figure 7:
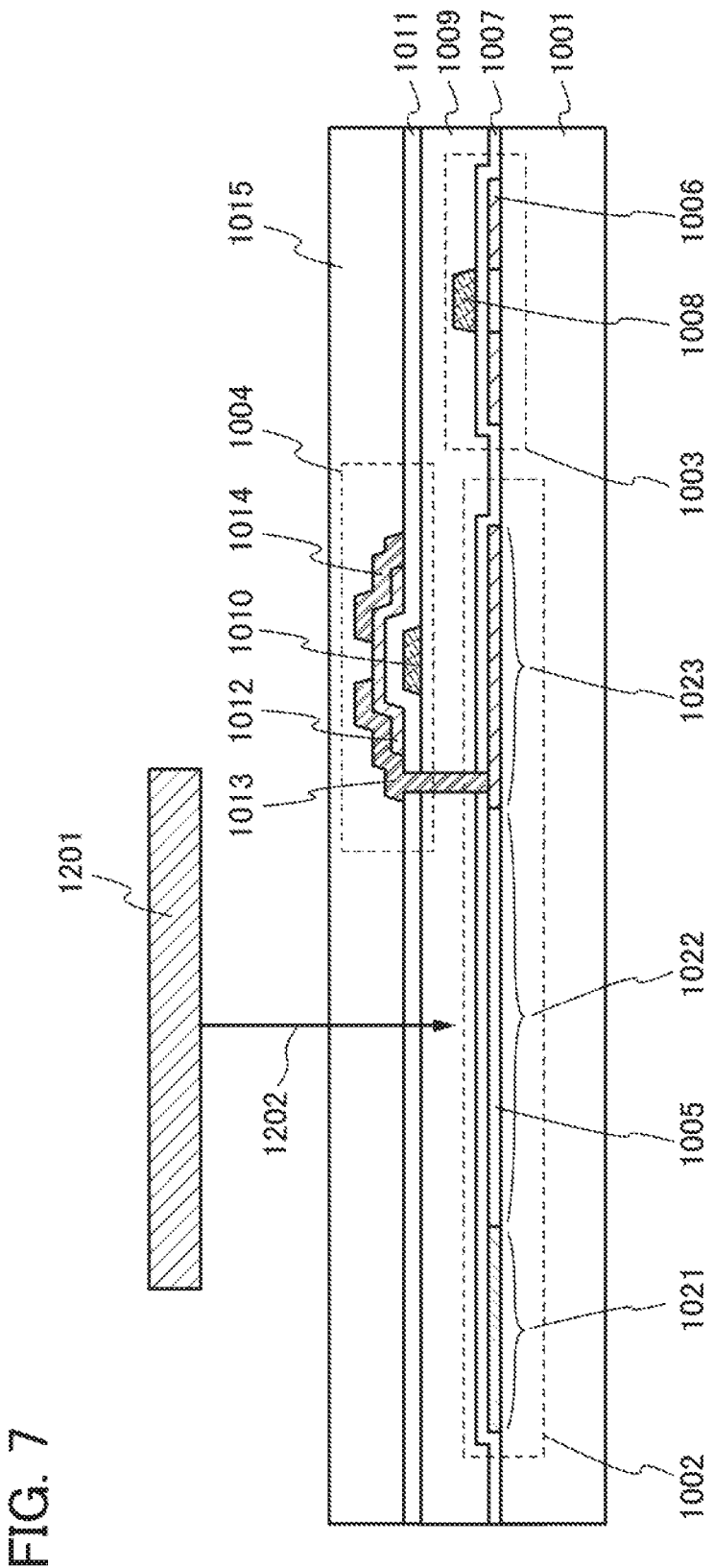
FIG. 7 illustrates an example of a semiconductor device.

In this embodiment, a structure and manufacturing method of a semiconductor device including a photosensor will be described. FIG. 7 is a cross-sectional view of a semiconductor device. Note that the following semiconductor device can be applied to a display device.

In FIG. 7, a photodiode 1002, a transistor 1003, and a transistor 1004 are provided over a substrate 1001 having an insulating surface. The photodiode 1002, the transistor 1003, and the transistor 1004 are cross-sectional views of the photodiode 204, the transistor 205, and the transistor 207, respectively, in FIG. 2 and FIGS. 6A to 6D. Light 1202 emitted from an object to be detected 1201, external light 1202 reflected by the object to be detected 1201, or light 1202 emitted from the inside of the device and reflected by the object to be detected 1201 enters the photodiode 1002. An object to be detected may be provided on the substrate 1001 side.

The substrate 1001 can be an insulating substrate (e.g., a glass substrate or a plastic substrate), the insulating substrate on which an insulating film (e.g., a silicon oxide film or a silicon nitride film) is formed, a semiconductor substrate (e.g., a silicon substrate) on which the insulating film is formed, or a metal substrate (e.g., an aluminum substrate) on which the insulating film is formed.

The photodiode 1002 is a lateral-junction PIN diode and includes a semiconductor film 1005. The semiconductor film 1005 includes a region having p-type conductivity (a p-layer 1021), a region having i-type conductivity (i-layer 1022), and a region having n-type conductivity (n-layer 1023). Note that the photodiode 1002 may be a PN diode.

The lateral-junction PIN or PN diode can be formed by adding a p-type impurity and an n-type impurity to predetermined regions of the semiconductor film 1005.

A single crystal semiconductor (e.g., single crystal silicon) with few crystal defects is preferably used for the photodiode 1002 so as to improve the proportion of an electric signal generated from incident light (the quantum efficiency).

The transistor 1003 is a top-gate thin film transistor and includes a semiconductor film 1006, a gate insulating film 1007, and a gate electrode 1008.

The transistor 1003 has a function of converting a charge supplied from the photodiode 1002 into an output signal. Therefore, a single crystal semiconductor (e.g., single crystal silicon) is preferably used for the semiconductor film 1006 to obtain a transistor with high mobility.

An example of forming the semiconductor film 1005 and the semiconductor film 1006 with the use of a single crystal semiconductor will be described. A damaged region is formed at a desired depth of a single crystal semiconductor substrate (e.g., a single crystal silicon substrate) by ion irradiation or the like. The single crystal semiconductor substrate and the substrate 1001 are bonded to each other with an insulating film interposed therebetween; then, the single crystal semiconductor substrate is split along the damaged region, whereby a semiconductor film is formed over the substrate 1001. The semiconductor film is processed (patterned) into a desired shape by etching or the like, so that the semiconductor film 1005 and the semiconductor film 1006 are formed. Since the semiconductor film 1005 and the semiconductor film 1006 can be formed in the same process, cost reduction can be realized. In this manner, the photodiode 1002 and the transistor 1003 can be formed on the same surface.

Note that an amorphous semiconductor, a microcrystal semiconductor, a polycrystalline semiconductor, an oxide semiconductor, or the like can also be used for the semiconductor film 1005 and the semiconductor film 1006. In particular, a single crystal semiconductor is preferably used to obtain a transistor with high mobility. As the semiconductor material, it is preferable to use silicon semiconductor such as silicon or silicon germanium, the crystallinity of which can be easily increased.

Here, the semiconductor film 1005 is preferably made thick in order to improve the quantum efficiency of the photodiode 1002. Further, the semiconductor film 1006 is preferably made thin in order to improve the electrical properties such as the S value of the transistor 1003. In that case, the semiconductor film 1005 is only required to be made thicker than the semiconductor film 1006.

A crystal semiconductor is also preferably used for the transistor 206 in FIG. 2 and FIGS. 6A to 6D so as to obtain a transistor with high mobility. By using the same semiconductor material as the transistor 1003, the transistor 206 can be formed in the same process as the transistor 1003, resulting in cost reduction.

Note that the gate insulating film 1007 is formed as a single layer or stacked layers using a silicon oxide film, a silicon nitride film, or the like. The gate insulating film 1007 may be formed by plasma CVD or sputtering.

Note that the gate electrode 1008 is formed as a single layer or stacked layers using a metal material such as molybdenum, titanium, chromium, tantalum, tungsten, aluminum, copper, neodymium, or scandium, or an alloy material including any of these materials as a main component. The gate electrode 1008 may be formed by sputtering or vacuum evaporation.

The photodiode 1002 can have a stacked structure of a p-layer, an i-layer, and an n-layer instead of the lateral-junction structure. The transistor 1003 can be a bottom-gate transistor, and can have a channel-stop structure or a channel-etched structure.

Figure 9:
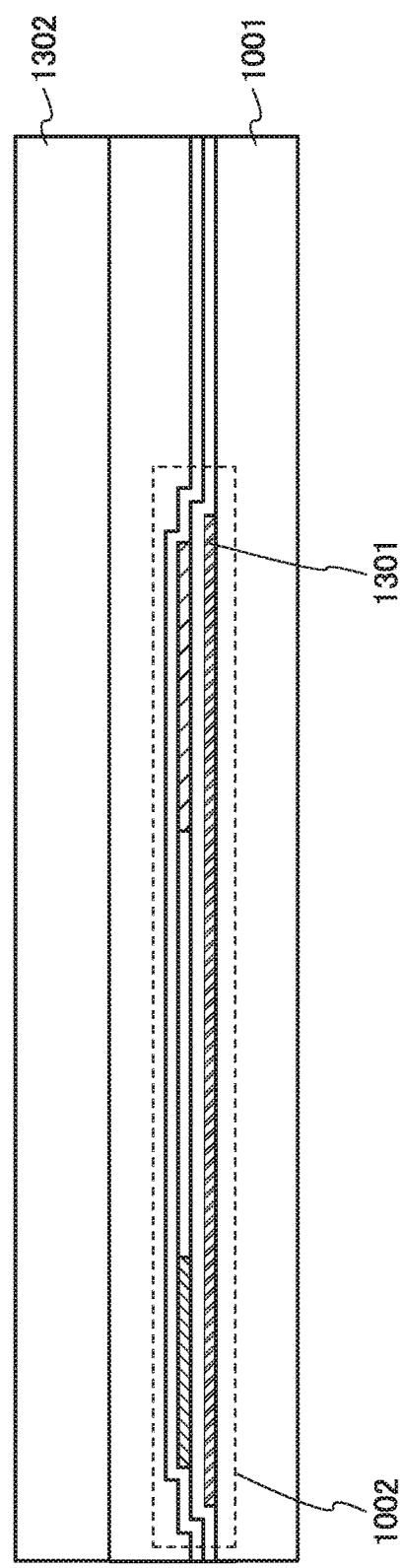
FIG. 9 illustrates an example of a semiconductor device.

Note that as illustrated in FIG. 9, a light-blocking film 1301 may be provided under the photodiode 1002, so that light other than light to be detected can be blocked. A light-blocking film may be provided over the photodiode 1002. In that case, a light-blocking film can be provided, for example, over a substrate 1302 opposite to the substrate 1001 provided with the photodiode 1002.

Figure 12:
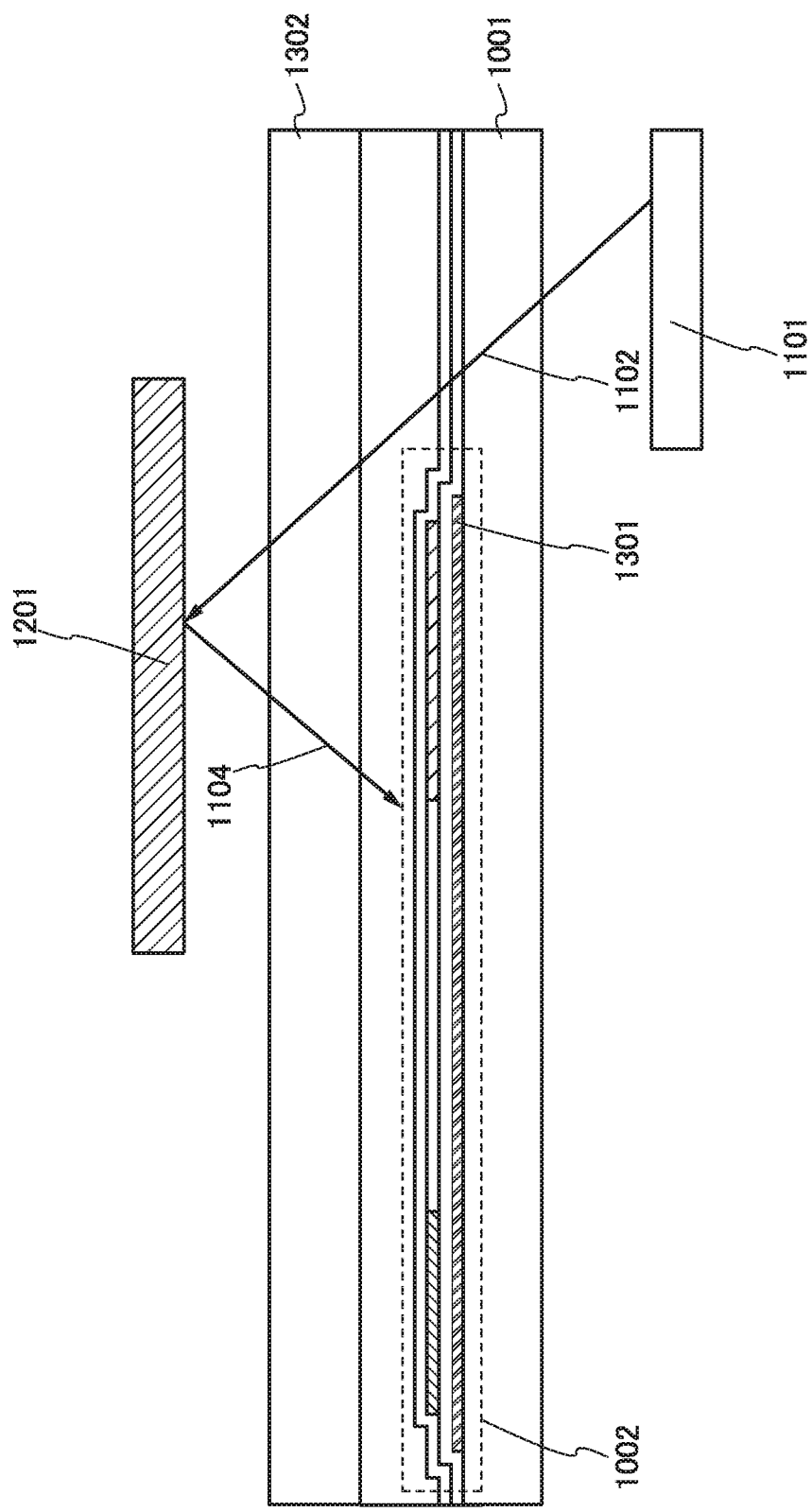
FIG. 12 illustrates an example of a semiconductor device.

The case of driving with the field sequential method shown in Embodiment 4 will be described. As illustrated in FIG. 12, light 1102 of a certain color (e.g., red (R), green (G), or blue (B)) is sequentially emitted from a light 1101 (a backlight or a flashlight). The light 1102 is emitted to the object to be detected 1201 and reflected by the object to be detected 1201. Reflected light 1104 enters the photodiode 1002. In a photosensor including the photodiode 1002, reset operation and accumulation operation are performed to detect the light 1104. After the accumulation operation of each color is completed, selection operation is sequentially performed in all the photosensors, whereby a color image can be taken.

Also in FIG. 12, the light-blocking film 1301 may be provided under the photodiode 1002, so that the light 1102 from the light 1101 does not directly enter the photodiode 1002.

In the structure illustrated in FIG. 12, the object to be detected 1201 is provided on the substrate 1302 side opposite to the substrate 1001 provided with the photodiode 1002, and an image thereof is taken; it is also possible to employ another structure in which an object to be detected is provided on the substrate 1001 side provided with the photodiode 1002, and an image thereof is taken. In the latter case, for example, the light 1101 may be provided on the substrate 1302 side and the light-blocking film 1301 may be provided over the photodiode 1002.

In FIG. 7, the transistor 1004 is a bottom-gate inverted-staggered thin film transistor and includes a gate electrode 1010, a gate insulating film 1011, a semiconductor film 1012, an electrode 1013, and an electrode 1014. An insulating film 1015 is provided over the transistor 1004. Note that the transistor 1004 may be a top-gate transistor.

A feature of the structure is that the transistor 1004 is formed over the photodiode 1002 and the transistor 1003 with an insulating film 1009 interposed therebetween. When the transistor 1004 and the photodiode 1002 are formed on different layers in this manner, the area of the photodiode 1002 can be increased to increase the amount of light received by the photodiode 1002.

Furthermore, part or the whole of the transistor 1004 is preferably formed to overlap with either the n-layer 1023 or the p-layer 1021 of the photodiode 1002. This is because the area of the photodiode 1002 can be increased and the overlapping area of the transistor 1004 and the i-layer 1022 can be made as small as possible so that light can be received efficiently. Also in the case of a PN diode, a smaller overlapping area of the transistor 1004 and a PN junction enables efficient light reception.

The function of the transistor 1004 is to accumulate an output signal of the photodiode 1002 as a charge in the gate of the transistor 1003 and retain the charge. Therefore, the semiconductor film 1012 preferably uses an oxide semiconductor to have an extremely low off-current.

It is also preferable that the transistor 601 in FIGS. 6A to 6D use an oxide semiconductor to have an extremely low off-current. By using the same semiconductor material as the transistor 1004, the transistor 601 can be formed in the same process as the transistor 1004, resulting in cost reduction. Note that for each of the aforementioned semiconductor elements, a thin film semiconductor or a bulk semiconductor may be used.

An example of forming the semiconductor film 1012 using an oxide semiconductor will be shown below.

One of the factors that increase the off-current of a transistor is an impurity such as hydrogen (e.g., hydrogen, water, or a hydroxyl group) contained in an oxide semiconductor. Hydrogen or the like might be a carrier supplier (a donor) in an oxide semiconductor, which causes electric current even in the off state. That is, an oxide semiconductor containing a large amount of hydrogen or the like becomes an n-type oxide semiconductor.

Thus, in the manufacturing method shown below, the amount of hydrogen in an oxide semiconductor is reduced as much as possible and the concentration of oxygen which is a constituent element is increased, whereby the oxide semiconductor is highly purified. The highly-purified oxide semiconductor is an intrinsic or substantially intrinsic semiconductor, resulting in a reduction in off-current.

First, an oxide semiconductor film is formed over the insulating film 1009 by sputtering. Note that, because the transistor in FIG. 7 is a bottom-gate transistor, the oxide semiconductor film is formed over the insulating film 1009 with the gate electrode 1010 and the gate insulating film 1011 interposed therebetween. In the case where a top-gate transistor is used, the gate insulating film 1011 and the gate electrode 1010 may be formed after the oxide semiconductor film is formed.

As a target used for forming the oxide semiconductor film, a target of a metal oxide containing zinc oxide as a main component can be used. For example, it is possible to use a target with a composition ratio of $In_2O_3$:$Ga_2O_3$:ZnO=1:1:1, that is, In:Ga:Zn=1:1:0.5. It is also possible to use a target with a composition ratio of In:Ga:Zn=1:1:1 or a composition ratio of In:Ga:Zn=1:1:2. Further, a target which includes $SiO_2$ at 2 wt % to 10 wt % inclusive can be used.

Note that the oxide semiconductor film may be formed in a rare gas (typically, argon) atmosphere, an oxygen atmosphere, or a mixed atmosphere of a rare gas and oxygen. Here, a sputtering gas used for forming the oxide semiconductor film is a high-purity gas in which impurities such as hydrogen, water, hydroxyl groups, or hydride are reduced to such a level that the concentration thereof can be expressed by ppm or ppb.

The oxide semiconductor film is formed by introducing a sputtering gas from which hydrogen and moisture are removed while removing moisture remaining in a treatment chamber. In order to remove moisture remaining in the treatment chamber, an entrapment vacuum pump is preferably used. For example, a cryopump, an ion pump, or a titanium sublimation pump is preferably used.

The thickness of the oxide semiconductor film may be 2 nm to 200 nm inclusive, preferably 5 nm to 30 nm inclusive. Then, the oxide semiconductor film is processed (patterned) into a desired shape by etching or the like, whereby the semiconductor film 1012 is formed.

Although an In—Ga—Zn—O is used for the oxide semiconductor film in the above example, the following oxide semiconductors can also be used: In—Sn—Ga—Zn—O, In—Sn—Zn—O, In—Al—Zn—O, Sn—Ga—Zn—O, Al—Ga—Zn—O, Sn—Al—Zn—O, In—Zn—O, Sn—Zn—O, Al—Zn—O, Zn—Mg—O, Sn—Mg—O, In—Mg—O, In—O, Sn—O, Zn—O, and the like. The oxide semiconductor film may contain Si. Further, the oxide semiconductor film may be amorphous or crystalline. Further, the oxide semiconductor film may be non-single-crystal or single crystal.

As the oxide semiconductor film, a thin film represented by $InMO_3 (ZnO)_m$ (m>0, and m is not a natural number) can also be used. Here, M denotes one or more of metal elements selected from Ga, Al, Mn, and Co. For example, M can be Ga, Ga and Al, Ga and Mn, or Ga and Co.

Next, first heat treatment is performed on the oxide semiconductor film (the semiconductor film 1012). The temperature of the first heat treatment is higher than or equal to 400° C. and lower than or equal to 750° C., preferably higher than or equal to 400° C. and lower than the strain point of the substrate.

Through the first heat treatment, hydrogen, water, hydroxyl groups, and the like can be removed from the oxide semiconductor film (the semiconductor film 1012) (dehydrogenation treatment). The dehydrogenation treatment through the first heat treatment is significantly effective because such impurities become a donor in the oxide semiconductor film and increase the off-current of the transistor.

Note that the first heat treatment can be performed with an electric furnace. Alternatively, heat conduction or heat radiation from a heating element such as a resistance heating element can be used for the first heat treatment. In that case, an RTA (rapid thermal anneal) apparatus such as a GRTA (gas rapid thermal anneal) apparatus or an LRTA (lamp rapid thermal anneal) apparatus can be used.

An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp.

A GRTA apparatus is an apparatus for heat treatment using a high-temperature gas. As the gas, an inert gas (typically, a rare gas such as argon) or a nitrogen gas can be used. The use of the GRTA apparatus is particularly effective because high-temperature heat treatment in a short time is enabled.

The first heat treatment may be performed before the patterning of the oxide semiconductor film, after the formation of the electrode 1013 and the electrode 1014, or after the formation of the insulating film 1015. However, the first heat treatment is preferably performed before the formation of the electrode 1013 and the electrode 1014 so that the electrodes are not damaged by the first heat treatment.

During the first heat treatment, oxygen deficiencies might be generated in the oxide semiconductor. Therefore, after the first heat treatment, oxygen is preferably introduced to the oxide semiconductor (treatment for supplying oxygen) so that oxygen which is a constituent element is highly purified.

Specifically, as the treatment for supplying oxygen, the first heat treatment is followed by second heat treatment in an oxygen atmosphere or an atmosphere containing nitrogen or oxygen (for example, the volume ratio of nitrogen to oxygen is 4 to 1), for example. Alternatively, plasma treatment may be performed in an oxygen atmosphere, so that the oxygen concentration in the oxide semiconductor film can be increased and the oxide semiconductor film can be highly purified. The temperature of the second heat treatment is higher than or equal to 200° C. and lower than or equal to 400° C., preferably higher than or equal to 250° C. and lower than or equal to 350° C.

As another example of the treatment for supplying oxygen, an oxide insulating film (the insulating film 1015) is formed on and in contact with the semiconductor film 1012, and then third heat treatment is performed. Oxygen in the insulating film 1015 moves to the semiconductor film 1012 to increase the oxygen concentration in the oxide semiconductor, whereby the oxide semiconductor film can be highly purified. The temperature of the third heat treatment is higher than or equal to 200° C. and lower than or equal to 400° C., preferably higher than or equal to 250° C. and lower than or equal to 350° C. Note that also in the case of a top-gate transistor, the oxide semiconductor can be highly purified in such a manner that a gate insulating film on and in contact with the semiconductor film 1012 is formed of a silicon oxide film or the like and similar heat treatment is performed.

As described above, the oxide semiconductor film can be highly purified through the treatment for supplying oxygen such as the second heat treatment or the third heat treatment after the dehydrogenation treatment by the first heat treatment. When being highly purified, the oxide semiconductor can be made intrinsic or substantially intrinsic, resulting in a reduction in the off-current of the transistor 1004.

Note that the insulating film 1009 is a single layer or stacked layers using a silicon oxide film, a silicon nitride film, or the like, and is formed over the photodiode 1002 and the transistor 1003. The insulating film 1009 may be formed by plasma CVD or sputtering. The insulating film 1009 may also be formed of a resin film such as a polyimide film by coating.

The gate electrode 1010 is formed as a single layer or stacked layers using a metal material such as molybdenum, titanium, chromium, tantalum, tungsten, aluminum, copper, neodymium, or scandium, or an alloy material including any of these materials as a main component. The gate electrode 1010 may be formed by sputtering or vacuum evaporation.

The gate insulating film 1011 is formed as a single layer or stacked layers using a silicon oxide film, a silicon nitride film, or the like. The gate insulating film 1011 may be formed by plasma CVD or sputtering.

The electrode 1013 and the electrode 1014, which are formed over the gate insulating film 1011 and the semiconductor film 1012, each are a single layer or stacked layers using a metal such as molybdenum, titanium, chromium, tantalum, tungsten, aluminum, copper, or yttrium, an alloy material including any of these materials as a main component, or a metal oxide having conductivity such as indium oxide. The electrode 1013 and the electrode 1014 may be formed by sputtering or vacuum evaporation. Here, it is preferable that the electrode 1013 be electrically connected to the n-layer 1023 of the photodiode 1002 through a contact hole formed in the gate insulating film 1007, the insulating film 1009, and the gate insulating film 1011.

The highly-purified oxide semiconductor and a transistor using the same will be described in detail below.

As an example of the highly-purified semiconductor, there is an oxide semiconductor whose carrier concentration is less than $1\times10^{14}/cm^3$, preferably less than $1\times10^{12}/cm^3$, and more preferably less than $1\times10^{11}/cm^3$ or less than $6.0\times10^{10}/cm^3$.

A transistor using a highly-purified oxide semiconductor is characterized in that the off-current is much lower than that of a transistor including a semiconductor containing silicon, for example.

The following shows the result of measuring the off-current characteristics of a transistor with an evaluation element (also referred to as TEG: Test Element Group). Note that the description is made here on an n-channel transistor.

Figure 8:
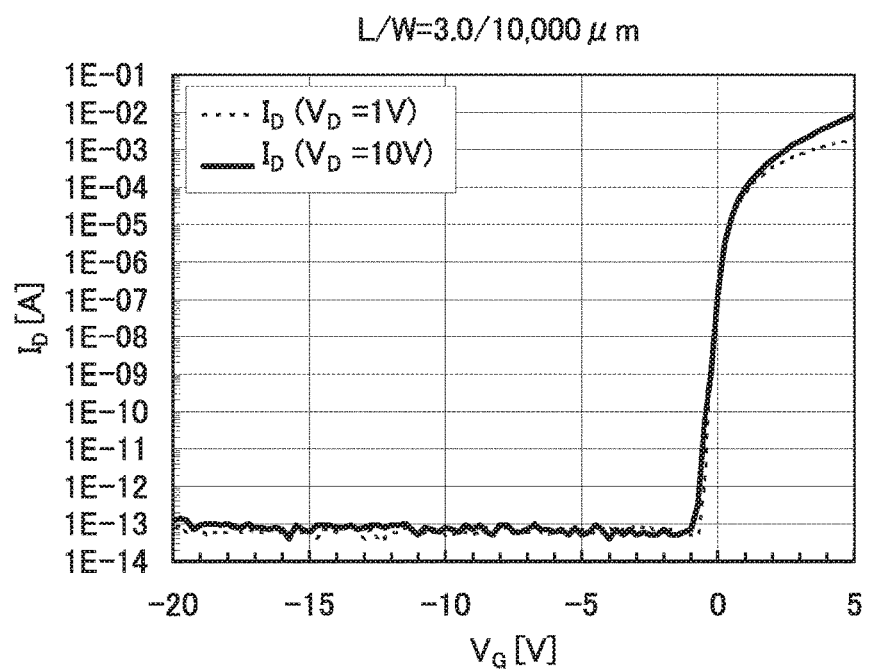
FIG. 8 illustrates electric properties of a transistor.

In the TEG, a transistor with L/W=3 µm/10000 µm, which includes 200 transistors with L/W=3 µm/50 µm (thickness d: 30 nm) connected in parallel, is provided. FIG. 8 illustrates the initial characteristics of the transistor. Here, $V_G$ is in the range of −20 V to +5 V inclusive. In order to measure the initial characteristics of the transistor, the characteristics of changes in the source-drain current (hereinafter, referred to as a drain current or $I_D$), i.e., $V_G$-$I_D$ characteristics, were measured under the conditions where the substrate temperature was set to room temperature, the voltage between the source and the drain (hereinafter, referred to as a drain voltage or $V_D$) was set to 10 V, and the voltage between the source and the gate (hereinafter, referred to as a gate voltage or $V_G$) was changed from −20 V to +20 V.

As illustrated in FIG. 8, the transistor with a channel width W of 10000 µm has an off-current of $1\times10^{13}$ A or less at $V_D$ of 1 V and 10 V, which is less than or equal to the resolution (100 fA) of a measurement device (a semiconductor parameter analyzer, Agilent 4156C manufactured by Agilent Technologies Inc.). The off-current per micrometer of the channel width corresponds to 10 aA/µm.

Note that in this specification, the off-current (also referred to as leakage current) means a current flowing between a source and a drain of an n-channel transistor when a predetermined gate voltage in the range of −20 V to −5 V inclusive is applied at room temperature in the case where the n-channel transistor has a positive threshold voltage $V_{th}$. Note that the room temperature is 15° C. to 25° C. inclusive. A transistor including the oxide semiconductor that is disclosed in this specification has a current per unit channel width (W) of 100 aA/µm or less, preferably 1 aA/µm or less, and more preferably 10 zA/µm or less at room temperature.

Moreover, the transistor including a high-purity oxide semiconductor has favorable temperature characteristics. Typically, in the temperature range of −25° C. to 150° C. inclusive, the current-voltage characteristics of the transistor, such as an on-current, an off-current, field-effect mobility, an S value, and a threshold voltage, hardly change and deteriorate due to temperature.

This embodiment can be implemented in appropriate combination with the other embodiments.

This application is based on Japanese Patent Application serial no. 2010-006444 filed with Japan Patent Office on Jan. 15, 2010, Japanese Patent Application serial no. 2010-006445 filed with Japan Patent Office on Jan. 15, 2010, and Japanese Patent Application serial no. 2010-006449 filed with Japan Patent Office on Jan. 15, 2010, the entire contents of which are hereby incorporated by reference.

EXPLANATION OF REFERENCE

100: display panel, 101: pixel circuit, 102: display element control circuit, 103: photosensor control circuit, 104: pixel, 105: display element, 106: photosensor, 107: display element driver circuit, 108: display element driver circuit, 109: photosensor reading circuit, 110: photosensor driver circuit, 200: precharge circuit, 201: transistor, 202: storage capacitor, 203: liquid crystal element, 204: photodiode, 205: transistor, 206: transistor, 207: transistor, 208: gate signal line, 209: gate signal line, 210: reset signal line, 211: gate signal line, 212: video data signal line, 213: photosensor reference signal line, 214: photosensor output signal line, 215: gate signal line, 216: transistor, 217: precharge signal line, 301: signal, 302: signal, 303: signal, 304: signal, 305: signal, 306: signal, 401: signal, 402: signal, 403: signal, 404: signal, 405: signal, 406: signal, 407: signal, 408: signal, 409: signal, 410: period, 411: period, 412: period, 413: period, 501: signal, 502: signal, 503: signal, 504: signal, 505: signal, 506: signal, 507: signal, 508: signal 509: signal, 510: period, 511: period, 512: period, 513: period, 601: transistor, 701: signal, 702: signal, 703: signal, 704: signal, 705: signal, 706: signal, 707: signal, 708: signal, 709: signal, 710: period, 711: period, 712: period, 713: period, 714: period, 715: period, 801: signal, 802: signal, 803: signal, 804: signal, 805: signal, 806: signal, 807: signal, 808: signal, 809: signal, 810: period, 811: period, 812: period, 813: period, 814: period, 815: period, 1001: substrate, 1002: photodiode, 1003: transistor, 1004: transistor, 1005: semiconductor film, 1006: semiconductor film, 1007: gate insulating film, 1008: gate electrode, 1009: insulating film, 1010: gate electrode, 1011: gate insulating film, 1012: semiconductor film, 1013: electrode, 1014: electrode, 1015: insulating film, 1101: light, 1102: light, 1104: light, 1021: player, 1022: i-layer, 1023: n-layer, 1201: object to be detected, 1202: light, 1301: light-blocking-film, 1302: substrate

The invention claimed is:

1. A semiconductor device comprising:
a substrate;
a backlight;
a light-receiving element;
a first transistor; and
a second transistor,
wherein the light-receiving element is electrically connected to a gate of the first transistor through the second transistor,
wherein each of the first transistor and the second transistor comprises a crystalline oxide semiconductor in a channel formation region,
wherein the crystalline oxide semiconductor comprises indium, gallium and zinc,
wherein an off-state current of the second transistor per micrometer of a channel width is 10 aA/μm or less,
wherein the light-receiving element is provided over the substrate,
wherein the backlight is provided under the substrate, and
wherein the light-receiving element is configured to receive a light emitted from the backlight.

2. The semiconductor device according to claim 1, wherein the light-receiving element is a photodiode.

3. The semiconductor device according to claim 1, wherein the light-receiving element comprises a single crystal semiconductor.

4. The semiconductor device according to claim 1, wherein the crystalline oxide semiconductor is an intrinsic or substantially intrinsic semiconductor.

5. The semiconductor device according to claim 1, wherein the off-state current is a current at 15° C. to 25° C. inclusive.

6. The semiconductor device according to claim 1, further comprising an insulating layer over the first transistor,
wherein the second transistor is provided over the insulating layer, and
wherein the second transistor overlaps with the light-receiving element at least partly.

7. A semiconductor device comprising:
a substrate;
a backlight;
a light-receiving element;
a first transistor;
a second transistor; and
a third transistor,
wherein the light-receiving element is electrically connected to a gate of the first transistor through the second transistor,
wherein one of a source and a drain of the third transistor is electrically connected to the gate of the first transistor,
wherein each of the first transistor, the second transistor and the third transistor comprises a crystalline oxide semiconductor in a channel formation region,
wherein the crystalline oxide semiconductor comprises indium, gallium and zinc,
wherein an off-state current of the second transistor per micrometer of a channel width is 10 aA/μm or less,
wherein the light-receiving element is provided over the substrate,
wherein the backlight is provided under the substrate, and
wherein the light-receiving element is configured to receive a light emitted from the backlight.

8. The semiconductor device according to claim 7, wherein the light-receiving element is a photodiode.

9. The semiconductor device according to claim 7, wherein the light-receiving element comprises a single crystal semiconductor.

10. The semiconductor device according to claim 7, wherein the crystalline oxide semiconductor is an intrinsic or substantially intrinsic semiconductor.

11. The semiconductor device according to claim 7, wherein the off-state current is a current at 15° C. to 25° C. inclusive.

12. The semiconductor device according to claim 7, further comprising an insulating layer over the first transistor,
wherein the second transistor is provided over the insulating layer, and
wherein the second transistor overlaps with the light-receiving element at least partly.

13. A semiconductor device comprising:
a substrate;
a backlight;
a light-receiving element;
a first transistor;
an insulating layer over the light-receiving element and the first transistor; and
a second transistor over the insulating layer,
wherein the light-receiving element is electrically connected to the second transistor through an electrode,
wherein the electrode is provided in an opening of the insulating layer,
wherein the second transistor comprises a crystalline oxide semiconductor in a channel formation region,
wherein the crystalline oxide semiconductor comprises indium, gallium and zinc,
wherein an off-state current of the second transistor per micrometer of a channel width is 10 aA/μm or less,
wherein the light-receiving element is provided over the substrate, wherein the backlight is provided under the substrate, and wherein the light-receiving element is configured to receive a light emitted from the backlight.

14. The semiconductor device according to claim 13, wherein the light-receiving element is a photodiode.

15. The semiconductor device according to claim 13, wherein the light-receiving element comprises a single crystal semiconductor.

16. The semiconductor device according to claim 13, wherein the crystalline oxide semiconductor is an intrinsic or substantially intrinsic semiconductor.

* * * * *